(12) United States Patent
Kim et al.

(10) Patent No.: US 11,339,471 B2
(45) Date of Patent: May 24, 2022

(54) DEPOSITION APPARATUS AND DEPOSITION METHOD USING THE SAME

(71) Applicant: Samsung Display Co., Ltd., Yongin-si (KR)

(72) Inventors: Daeyong Kim, Yongin-si (KR); Sukbeom You, Anyang-si (KR); Sunwoo Kang, Hwaseong-si (KR); Youngmi Cho, Seoul (KR); Jinoh Kwag, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 101 days.

(21) Appl. No.: 16/658,910

(22) Filed: Oct. 21, 2019

(65) Prior Publication Data

US 2020/0123651 A1   Apr. 23, 2020

(30) Foreign Application Priority Data

Oct. 22, 2018   (KR) ........................ 10-2018-0126174

(51) Int. Cl.
*C23C 16/04* (2006.01)
*C23C 16/50* (2006.01)
(Continued)

(52) U.S. Cl.
CPC .......... *C23C 16/047* (2013.01); *C23C 14/042* (2013.01); *C23C 14/32* (2013.01);
(Continued)

(58) Field of Classification Search
None
See application file for complete search history.

(56) References Cited

U.S. PATENT DOCUMENTS

| 4,213,844 A | 7/1980 | Morimoto et al. |
| 4,246,641 A * | 1/1981 | Babil .................... G01K 15/00 374/1 |

(Continued)

FOREIGN PATENT DOCUMENTS

| JP | 4433100 | 3/2010 |
| JP | 4637390 | 2/2011 |

(Continued)

OTHER PUBLICATIONS

K. Yamanishi et al., "Synthesis of Superconducting Y—Ba—Cu—O Thin Films by Ionized Cluster Beam Codeposition", 2107B Nuclear Instrum. & Methods in Phys. Res./B B37/38 (1989) February (II), No. 2, Amsterdam, NL, 5 pages.

*Primary Examiner* — Ashok Patel
(74) *Attorney, Agent, or Firm* — H.C. Park & Associates, PLC

(57) ABSTRACT

A deposition apparatus includes a chamber, a stage which is disposed within the chamber and on which a target substrate is seated, a deposition source disposed within the chamber and including a deposition material, a plurality of nozzles connected to the deposition source within the chamber to inject the deposition material in a direction of the stage, and an ionizer disposed between the nozzles and the stage to charge the deposition material injected from the nozzles. A first electric field is generated in each of the ionizer and the nozzles, and a second electric field having an intensity less than the first electric field is generated between the stage and the ionizer. Each of the nozzles includes a plurality of protrusion tips disposed on an inner surface of each of the nozzles to charge the deposition material.

27 Claims, 23 Drawing Sheets

(51) Int. Cl.
  *H01L 51/56* (2006.01)
  *H01J 37/32* (2006.01)
  *C23C 14/32* (2006.01)
  *C23C 14/04* (2006.01)
  *H01L 27/32* (2006.01)
  *H01J 49/16* (2006.01)

(52) U.S. Cl.
  CPC ........ *C23C 16/50* (2013.01); *H01J 37/32009* (2013.01); *H01J 37/32073* (2013.01); *H01L 51/56* (2013.01); *H01J 49/168* (2013.01); *H01L 27/3248* (2013.01); *H01L 27/3262* (2013.01)

(56) References Cited

U.S. PATENT DOCUMENTS

| | | | |
|---|---|---|---|
| 4,374,162 A | 2/1983 | Takagi | |
| 4,974,544 A * | 12/1990 | Ohta | C23C 16/452 118/723 HC |
| 5,807,436 A | 9/1998 | Stachelhaus et al. | |
| 6,350,609 B1 | 2/2002 | Morozov et al. | |
| 6,787,313 B2 | 9/2004 | Morozov et al. | |
| 7,516,714 B2 | 4/2009 | Yamagata et al. | |
| 8,544,410 B2 | 10/2013 | Tanioka et al. | |
| 8,709,837 B2 | 4/2014 | Im et al. | |
| 8,853,678 B2 | 10/2014 | Uchida et al. | |
| 8,877,557 B2 | 11/2014 | Roh | |
| 9,206,501 B2 | 12/2015 | Sung et al. | |
| 9,273,390 B2 | 3/2016 | Shen et al. | |
| 9,425,399 B2 | 8/2016 | Zhang | |
| 9,847,483 B1 | 12/2017 | Hamamoto et al. | |
| 10,150,132 B2 | 12/2018 | Hamamoto et al. | |
| 2011/0033964 A1 | 2/2011 | Oh et al. | |
| 2011/0262625 A1 | 10/2011 | Park et al. | |
| 2012/0321813 A1 | 12/2012 | Roh et al. | |
| 2012/0321818 A1 | 12/2012 | Roh et al. | |
| 2013/0252364 A1 | 9/2013 | Kawato et al. | |
| 2014/0011312 A1 | 1/2014 | Roh | |
| 2015/0069429 A1 | 3/2015 | Ray et al. | |

FOREIGN PATENT DOCUMENTS

| | | |
|---|---|---|
| KR | 0806704 | 2/2008 |
| KR | 10-2012-0139387 | 12/2012 |
| KR | 20120139387 | 12/2012 |
| KR | 20130015144 | 2/2013 |
| KR | 20140008562 | 1/2014 |
| KR | 10-1398237 | 5/2014 |
| KR | 1398237 | 5/2014 |
| KR | 20160134529 | 11/2016 |
| KR | 20170028050 | 3/2017 |
| KR | 20180005082 | 1/2018 |
| KR | 20180046891 | 5/2018 |
| KR | 101852953 | 6/2018 |
| KR | 20130134708 | 9/2018 |
| WO | 2009060898 | 5/2009 |
| WO | 2013105557 | 7/2013 |
| WO | 2017038771 | 3/2017 |

* cited by examiner

DEPOSITION APPARATUS AND DEPOSITION METHOD USING THE SAME

CROSS-REFERENCE TO RELATED APPLICATION

This application claims priority from and the benefit of Korean Patent Application No. 10-2018-0126174, filed on Oct. 22, 2018, which is hereby incorporated by reference for all purposes as if fully set forth herein.

BACKGROUND

Field

Exemplary embodiments of the invention relate generally to a deposition apparatus and a deposition method using the same, and more specifically, to a deposition apparatus having deposition uniformity.

Discussion of the Background

Organic light emitting display devices are attracting attention as next generation display devices because they are capable of being driven at a low voltage, are lightweight and compact, and have a wide viewing angle, excellent contrast, and high response speed.

An intermediate layer, such as an electron injection layer, an electron transport layer, a hole transport layer, and a hole injection layer, may be selectively inserted between an electrode and a light emitting layer to obtain high-efficiency emission in such an organic light emitting display device.

Organic thin films used for the light emitting layer may be formed on a substrate through a deposition process. When the deposition process is performed, if the organic thin film is not uniformly formed on each of a plurality of emission areas, the yield of the organic light emitting display device may be deteriorated.

The above information disclosed in this Background section is only for understanding of the background of the inventive concepts, and, therefore, it may contain information that does not constitute prior art.

SUMMARY

Devices constructed according to exemplary embodiments of the invention are capable of providing a deposition apparatus having improved deposition uniformity.

Additional features of the inventive concepts will be set forth in the description which follows, and in part will be apparent from the description, or may be learned by practice of the inventive concepts.

An exemplary embodiment of the inventive concepts provides a deposition apparatus including: a chamber; a stage which is disposed within the chamber and on which a target substrate is seated; a deposition source disposed within the chamber and including a deposition material; a plurality of nozzles connected to the deposition source within the chamber to inject the deposition material in a direction of the stage; and an ionizer disposed between the nozzles and the stage to charge the deposition material injected from the nozzles, wherein a first electric field is generated in each of the ionizer and the nozzles, and a second electric field having an intensity less than that of the first electric field is generated between the stage and the ionizer.

Each of the nozzles may include a plurality of protrusion tips disposed on an inner surface of each of the nozzles to charge the deposition material.

The ionizer may include: a first electrode unit; and a second electrode unit disposed between the first electrode unit and the stage and having a plate shape in which a plurality of mesh holes are defined, wherein the first electrode unit may include: a first plate having a plate shape; and a plurality of pin electrodes disposed on the first plate to charge the deposition material injected from the nozzles.

A charging voltage may be applied to the nozzles, a first voltage may be applied to the first electrode unit, a second voltage less than each of the first voltage and the charging voltage may be applied to the second electrode unit, and a third voltage less than the second voltage may be applied to the stage.

The charging voltage may be the same as the first voltage.

The nozzles may be electrically connected to the first electrode unit.

A distance between the first electrode unit and the second electrode unit or between each of the nozzles and the second electrode unit may be less than that between the second electrode unit and the stage.

A plurality of holes may be defined in the first plate, and at least a portion of each of the plurality of nozzles may be inserted into each of the nozzle holes.

The deposition apparatus may further include a mask disposed between the stage and the ionizer, wherein the deposition material may be deposited on an area of the target substrate, which is exposed from the mask.

A charging voltage may be applied to the nozzles, a first voltage may be applied to the first electrode unit, a second voltage less than each of the first voltage and the charging voltage may be applied to the second electrode unit, and a third voltage less than the second voltage may be applied to the mask.

An inner surface of each of the mesh holes of the second electrode unit may include at least one inclined surface, and the inner surface of each of the mesh holes may have a shape pointed toward a center of each of the mesh holes on a plane.

The deposition apparatus may further include sub heating members configured to respectively surround the plurality of nozzles.

A density of the pin electrodes may decrease in a direction that is adjacent to the nozzles on the first plate.

The nozzles may be arranged in a first direction to overlap a central portion of the stage on a plane, and the second electrode unit may include: a first mesh electrode extending in the first direction to overlap the central portion of the stage on the plane; and a plurality of second mesh electrodes facing each other with the first mesh electrode therebetween in a second direction perpendicular to the first direction on the plane, wherein an electric field generated between the first mesh electrode and the first electrode unit may have an intensity less than that of an electric field generated between the second mesh electrode and the first electrode unit.

A voltage applied to the first mesh electrode may be greater than that applied to the second mesh electrode.

A distance between the first mesh electrode and the first electrode unit may be greater than that between the second mesh electrode and the first electrode unit.

The deposition apparatus may include a third electrode unit which is disposed between the ionizer and the stage and in which a plurality of holes are defined, wherein the second electric field may be generated between the third electrode unit and the stag A charging voltage may be applied to the nozzles, a first voltage may be applied to the first electrode unit, a second voltage less than each of the first voltage and the charging voltage may be applied to the second electrode unit, a third voltage less than the second voltage may be applied to the stage, and a fourth voltage equal to or less than the second voltage and greater than the third voltage may be applied to the third electrode unit. In an embodiment, the target substrate may include: a base layer; a plurality of thin film transistors disposed on the base layer; and a pixel electrodes electrically connected to one-to-one correspond to the thin film transistors, wherein the deposition material may be deposited on the pixel electrodes.

A charging voltage may be applied to the nozzles, a first voltage may be applied to the first electrode unit, a second voltage less than each of the first voltage and the charging voltage may be applied to the second electrode unit, and a third voltage less than the second voltage may be applied to at least one of the pixel electrodes.

A deposition apparatus may further include a deposition source moving unit disposed adjacent to the deposition source to allow the deposition source to move.

The nozzles may be arranged in a first direction, and the first plate of the first electrode unit may have a shape extending in the first direction.

The deposition apparatus may further include at least one heating member configured to surround the deposition source.

The deposition source may be provided in plurality, and the plurality of deposition sources may include deposition materials different from each other.

The first electric field may have an intensity equal to or greater than an ionization energy value of the deposition material and less than a decomposition energy value of the deposition material.

The deposition apparatus may further include an evaporation chamber disposed between the nozzles and the deposition source to evaporate the deposition material.

A top surface of each of the nozzles may have a shape pointed upward on a cross-section.

In an exemplary embodiment of the inventive concepts, a deposition method includes: seating a target substrate on a stage; evaporating a deposition material of a deposition source; forming a first electric field in an ionizer and nozzles to charge the deposition material; and depositing the deposition material on the target substrate, wherein the depositing of the deposition material may include forming a second electric field having an intensity less than that of the first electric field between the ionizer and the stage to guide a moving direction of the deposition material.

The ionizer may include: a first electrode unit; and a second electrode unit disposed between the first electrode unit and the stage and having a plate shape in which a plurality of mesh holes are defined, wherein the first electrode unit includes: a first plate having a plate shape; and a plurality of pin electrodes disposed on the first plate to charge the deposition material injected from the nozzles.

Each of the nozzles may include a plurality of protrusion tips formed on an inner surface of each of the nozzles, and the charging of the deposition material may include applying a charging voltage to the protrusion tips to charge the deposition material.

The charging of the deposition material may further include: applying a first voltage to the first electrode unit; and applying a second voltage less than each of the first voltage and the charging voltage to the second electrode unit.

The charging voltage may be the same as the first voltage.

The guiding of the deposition material may include applying a third voltage less than the second voltage to the stage.

The deposition method may further include disposing a mask on the target substrate, wherein the guiding of the deposition material may include applying a third voltage less than the second voltage to the mask.

The seating of the target substrate may include: forming a circuit layer including a thin film transistor on a base layer; and forming pixel electrodes on the circuit layer, and the guiding of the deposition material may include applying a third voltage less than the second voltage to at least one of the pixel electrodes.

The second electrode unit may include: a first mesh electrode overlapping a central portion of the stage on a plane; and a plurality of second mesh electrodes facing each other with the first mesh electrode therebetween on the plane, wherein the first mesh electrode and the second mesh electrodes are spaced apart from each other on the plane, a distance between the first mesh electrode and each of the nozzles is greater than that between each of the second mesh electrodes and each of the nozzles, and the forming of the first electric field may include: forming a first sub electric field between the first mesh electrode and the first electrode unit; and a second sub electric field having an intensity greater than that of the first sub electric field between each of the second mesh electrodes and the first electrode unit.

The charging of the deposition material may include applying different voltages to the first mesh electrode and each of the second mesh electrodes.

In the depositing of the deposition material, the moving direction of the deposition material in a region adjacent to the target substrate may have an angle of about 80 degrees to about 100 degrees with respect to a top surface of the stage.

In an exemplary embodiment of the inventive concepts, a deposition apparatus includes: a chamber; a stage which is disposed within the chamber and on which a target substrate is seated; a mask disposed on the target substrate; a deposition source disposed within the chamber and includes a deposition material; a plurality of nozzles connected to the deposition source within the chamber to inject the deposition material and including a plurality of protrusion tips disposed on an inner surface of each of the nozzles to charge the deposition material; and an ionizer disposed between the nozzles and the stage, wherein the ionizer includes: a first electrode unit including a plurality of pins configured to charge the deposition material injected from the nozzles; and a second electrode unit facing the first electrode unit and configured to generate a first electric field together with the first electrode unit and each of the nozzles, wherein the second electrode unit generates a second electric field having an intensity less than that of the first electric field together with at least one of the stage, the target substrate, or the mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
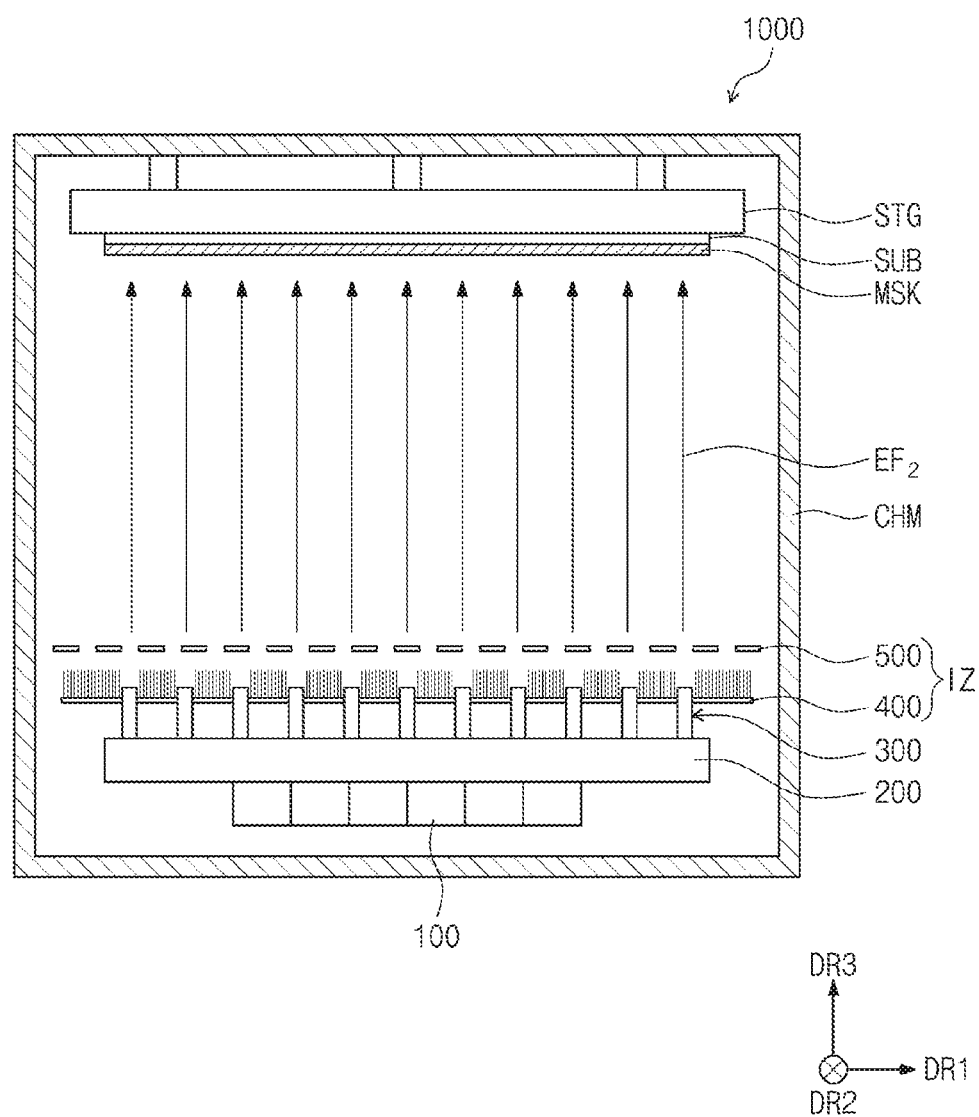
FIG. 1 is a schematic front view of a deposition apparatus according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
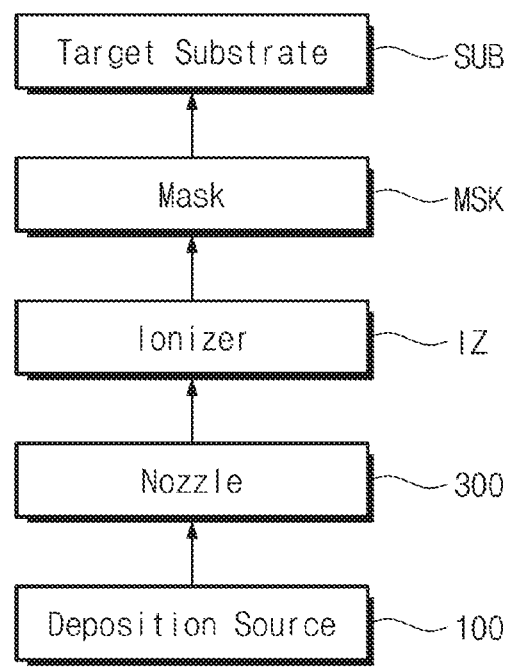
FIG. 2 is a flowchart illustrating a moving path of a deposition material according to an exemplary embodiment of the inventive concepts.

FIG. 1 is a schematic front view of a deposition apparatus according to an exemplary embodiment of the inventive concepts, and FIG. 2 is a flowchart illustrating a moving path of a deposition material according to an exemplary embodiment of the inventive concepts.

Referring to FIGS. 1 to 2, a deposition apparatus 1000 according to an exemplary embodiment of the inventive concepts may deposit a thin film on a target substrate SUB. For example, the deposition apparatus 1000 according to this embodiment may be used for manufacturing an organic light emitting display device. That is, the target substrate SUB may be a portion of an organic light emitting panel including organic light emitting elements, and the thin film may be one of organic thin films constituting the organic light emitting elements. For example, the thin film may be a light emitting layer. Alternatively, the thin film may be at least one of an electron injection layer, an electron transport layer, a hole transport layer, or a hole injection layer.

The deposition apparatus according to an exemplary embodiment of the inventive concept includes a chamber CHM, a stage STG, a deposition source 100, an evaporation chamber 200, nozzles 300, and an ionizer IZ.

The chamber CHM provides a space through which a deposition material moves. The chamber CHM is maintained in a vacuum state to prevent foreign substances from being introduced from the outside and secure straightness of the deposition material. Although the chamber CHM has a hexahedral shape in this embodiment, the chamber CHM according to the inventive concepts are not limited to a specific embodiment.

The stage STG is disposed within the chamber CHM. Particularly, the stage STG is disposed in an upper space of a space defined by the chamber CHM. Although not shown, the stage STG may be fixed within the chamber CHM by a stage fixing unit (not shown). The stage STG may have a flat plate shape parallel to a plane defined by a first direction DR1 and a second direction D2. The above-described target substrate SUB may be seated on a top surface of the stage STG. The top surface of the stage STG may face a bottom surface of the chamber CHM. According to this embodiment, a voltage may be applied to the stage STG.

Hereinafter, a third direction DR3 may be defined as a direction perpendicular to each of the first direction DR1 and the second direction DR2. The third direction DR3 is parallel to upward and downward directions that will be described below. Also, the third direction DR3 may be a reference direction for classifying front and rear surfaces of components that will be described below. However, the upward direction and the downward direction may be a relative concept and thus be changed in different directions.

The deposition source 100 is disposed within the chamber CHM. For example, the deposition source 100 may be disposed in a lower space of the chamber CHM. The deposition source 100 includes a deposition material (not shown). In this embodiment, the deposition material (not shown) may include an inorganic material. The deposition material may be a material that is in a liquid state at room temperature.

The evaporation chamber 200 is disposed on the deposition source 100 and connected to the deposition source 100. The deposition material introduced into the evaporation chamber 200 may be vaporized within the evaporation chamber 200. Although not shown, the deposition apparatus 1000 according to an exemplary embodiment of the inventive concepts may further include a pressure control unit (not shown) controlling a pressure of an inner space of the evaporation chamber 200. The deposition material that is in the liquid state may be vaporized within the evaporation chamber 200 by the pressure control unit. In another exemplary embodiment, the evaporation chamber 200 may be omitted.

The plurality of nozzles 300 may be disposed on the evaporation chamber 200 and connected to the evaporation chamber 200. The nozzles 300 may inject the deposition material toward the stage STG. In this embodiment, the nozzles 300 are arranged in the first direction DR1 on a plane. However, the exemplary embodiment is not specifically limited to the number of nozzles 300 or an arrangement relationship of the nozzles 300.

According to this embodiment, a voltage may be applied to the nozzles 300. The nozzles 300 include a conductive material. For example, the nozzles 300 may include a metal material.

The ionizer IZ is disposed above the nozzles 300. The ionizer IZ according to this embodiment includes two electrode units 400 and 500, each of which has a plate shape. The electrode units 400 and 500 are disposed to vertically face each other.

According to this embodiment, a voltage may be applied to each of the two electrode units 400 and 500. Thus, electric fields may be generated in a space defined by the ionizer IZ and the nozzles 300. The deposition material injected from the nozzles 300 may be charged by the electric fields generated by the nozzles 300 and the ionizer IZ. That is, the deposition material may lose or obtain electrons by the ionizer IZ.

Also, according to this embodiment, electric fields $EF_2$ may be generated in a space defined between the ionizer IZ and the stage STG. The electric fields $EF_2$ are parallel to the third direction DR3. The deposition material charged by the ionizer IZ moves along the direction of the electric fields $EF_2$. Thus, the deposition material may be deposited on the target substrate SUB seated on the stage STG.

The electric fields generated by the nozzle 300, the ionizer IZ, and the stage STG will be described in more detail with reference to FIG. 9.

Although not shown, the deposition apparatus 1000 according to an exemplary embodiment includes a plurality of power supply units (not shown). The power supply units may apply a voltage to each of the nozzles 300, the ionizer IZ, and the stage STG.

The deposition apparatus 1000 according to an exemplary embodiment further includes a mask MSK. The mask MSK is disposed on the target substrate SUB. That is, the mask MSK is disposed between the target substrate SUB and the ionizer IZ. The mask MSK is adjacent to the target substrate SUB. The mask MSK has a plurality of mask openings (not shown). The deposition material may be patterned on the target substrate SUB by the mask opening. That is, the deposition material may be deposited on each of areas of the target substrate SUB, which are exposed by the mask openings.

Figure 3:
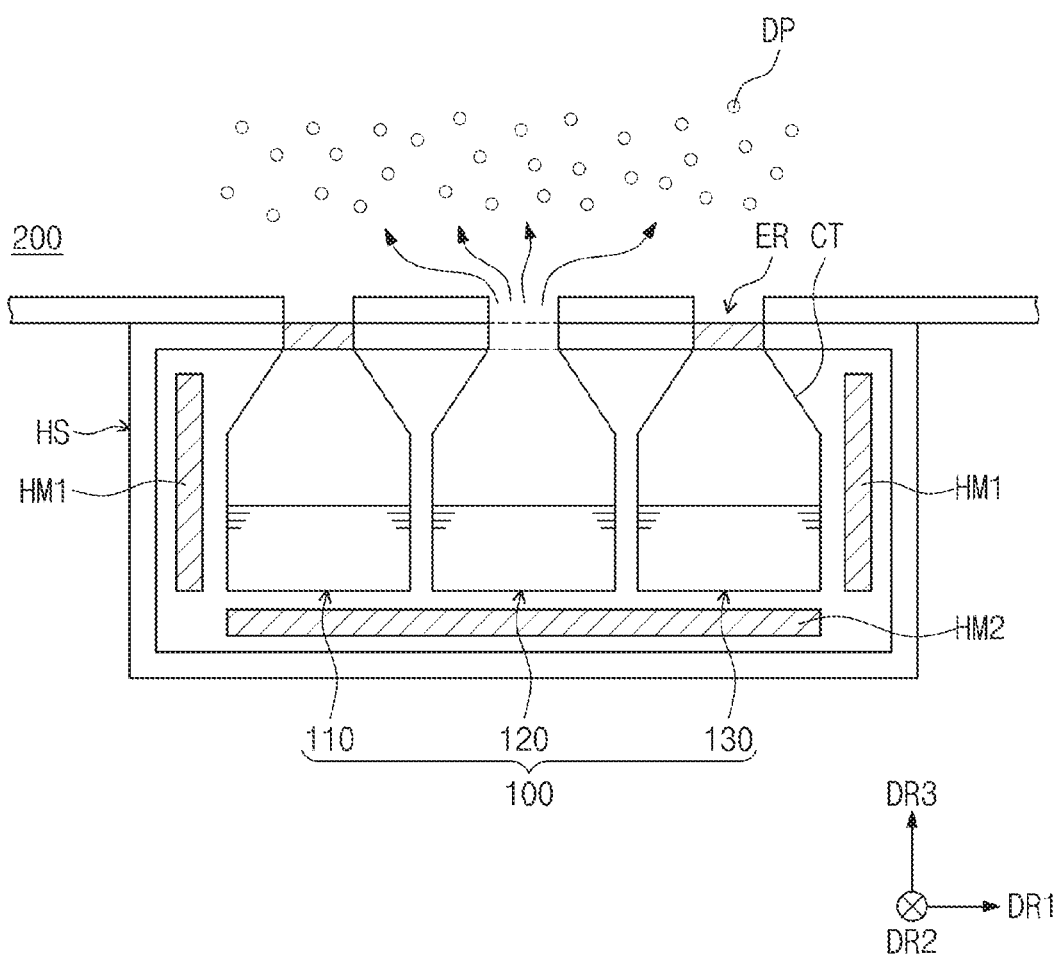
FIG. 3 is an enlarged cross-sectional view of a deposition source of FIG. 1.

FIG. 3 is an enlarged cross-sectional view of the deposition source of FIG. 1.

Referring to FIG. 3, the deposition source 100 according to an exemplary embodiment may be provided in plurality. The plurality of deposition sources 110, 120, and 130 may be respectively accommodated in containers CT different from each other. The deposition sources 110, 120, and 130 are arranged in the first direction DR1. However, the exemplary embodiment is not specifically limited to the arrangement relationship between the deposition sources 110, 120, and 130.

Also, although three deposition sources 110, 120, and 130 are illustrated in FIG. 3, the exemplary embodiment is not specifically limited to the number of deposition sources 110, 120, and 130. For example, according to another exemplary embodiment of the inventive concepts, three or more deposition sources may be provided. In another further embodiment, the deposition apparatus 1000 may include only one deposition source 100.

The deposition materials respectively contained in the deposition sources 110, 120, and 130 may be different from each other. For example, the first deposition source 110 may include a first material, the second deposition source 120 may include a second material, and the third deposition source 130 may include a third material.

For example, the first to third materials may include a host material and a dopant material, which constitute the light emitting layer of the organic light emitting element. Also, each of the first to third materials may include one of materials which respectively constitute the electron injection layer, the electron transport layer, the hole transport layer, and the hole injection layer of the organic light emitting element.

Each of the deposition sources 110, 120, and 130 is connected to the evaporation chamber 200. Particularly, the containers CT that respectively accommodate the deposition sources 110, 120, and 130 are connected to evaporation chamber 200 by discharge holes ER defined in upper portions of the container CT. The deposition materials of the deposition sources 110, 120, and 130 may move to the evaporation chamber 200 through the discharge holes ER. The deposition materials may be vaporized in the evaporation chamber 200 and be provided to the nozzles 300 (see FIGS. 1 and 2) in the form of a plurality of vapor particles DP.

According to an exemplary embodiment of the inventive concepts, the discharge holes ER may be selectively opened and closed according to kinds of deposition materials to be deposited. FIG. 3 illustrates an example of a case in which only one discharge hole ER of the plurality of discharge holes ER, which is connected to a second deposition source 120, is opened.

The deposition apparatus 1000 according to an exemplary embodiment includes at least one heating members HM1 and HM2. The heating members HM1 and HM2 may be accommodated in a housing HS together with the exposition sources 110, 120, and 130. In another exemplary embodiment, the housing HS may be omitted.

The heating members HM1 and HM2 are disposed to surround the deposition sources 110, 120, and 130. The heating members HM1 and HM2 may transfer heat to the deposition sources 110, 120, and 130.

FIG. 3 illustrates an example of a case in which the heating members HM1 and HM2 are provided in plurality. Particularly, the plurality of heating members HM1 and HM2 include a first heating member HM1 and a second heating member HM2. The first heating member HM1 is disposed adjacent to side surfaces of the deposition sources 110, 120, and 130 to heat the side surfaces of the deposition sources 110, 120, and 130. The second heating member HM2 is disposed below the deposition sources 110, 120, and 130 to heat bottom surfaces of the deposition sources 110, 120, and 130. The exemplary embodiments are not specifically limited to the shapes and the arrangement relationship of the heating members HM1 and HM2.

Figure 4:
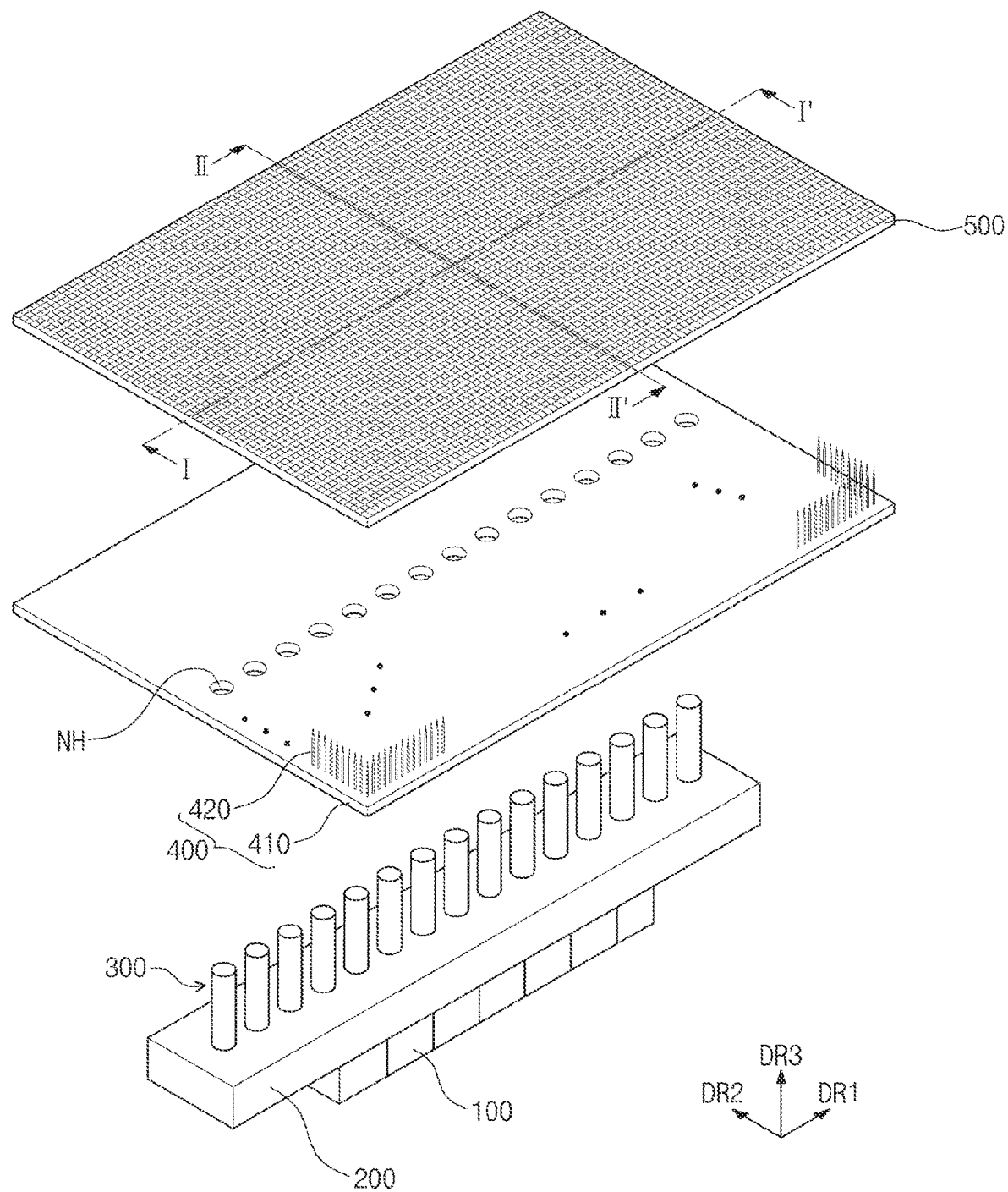
FIG. 4 is a perspective view of the deposition source, an evaporation chamber, nozzles, and an ionizer of FIG. 1.
Figure 5:
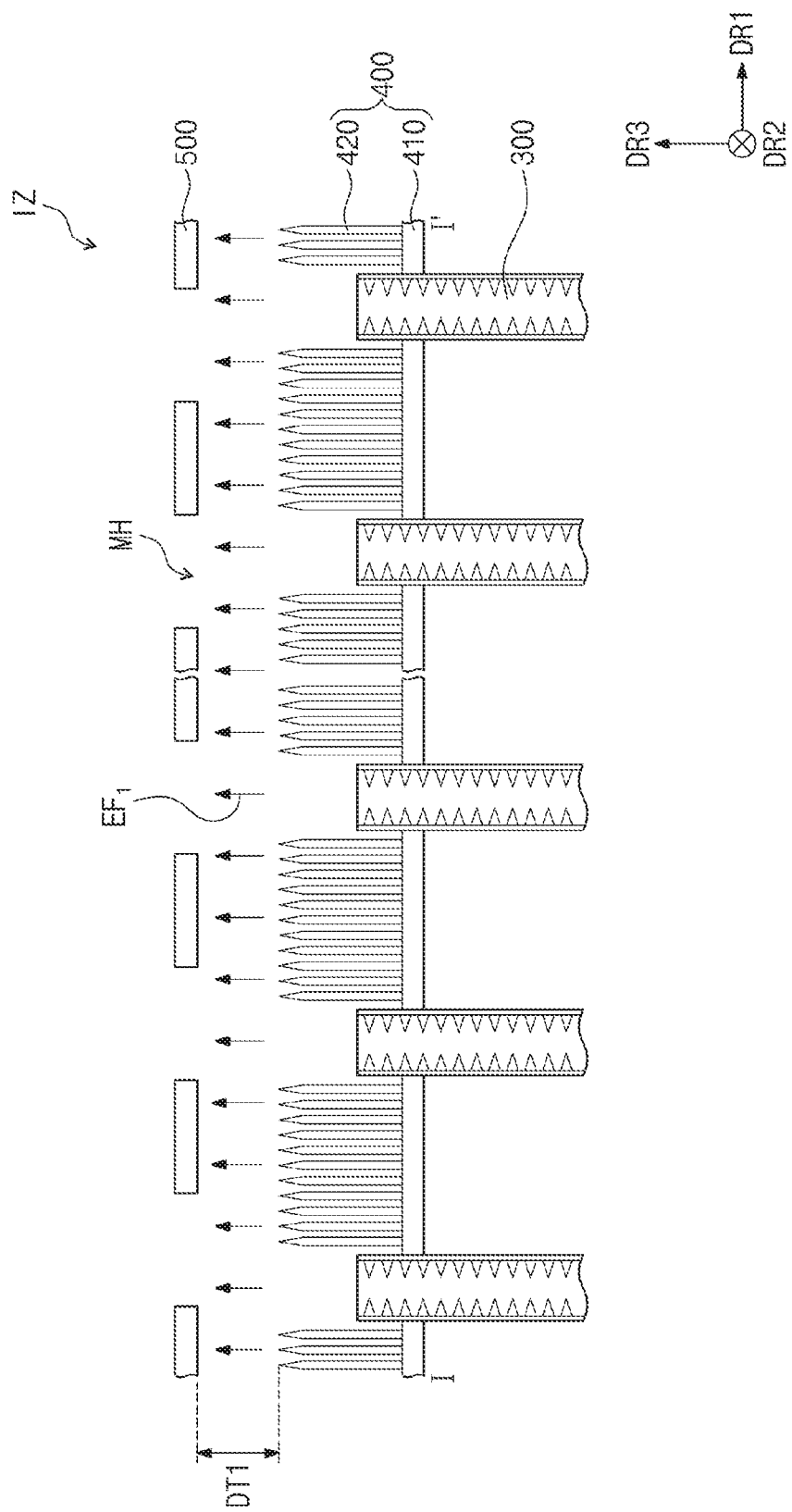
FIG. 5 is an enlarged cross-sectional view of the nozzles and the ionizer of FIG. 1.
Figure 6:
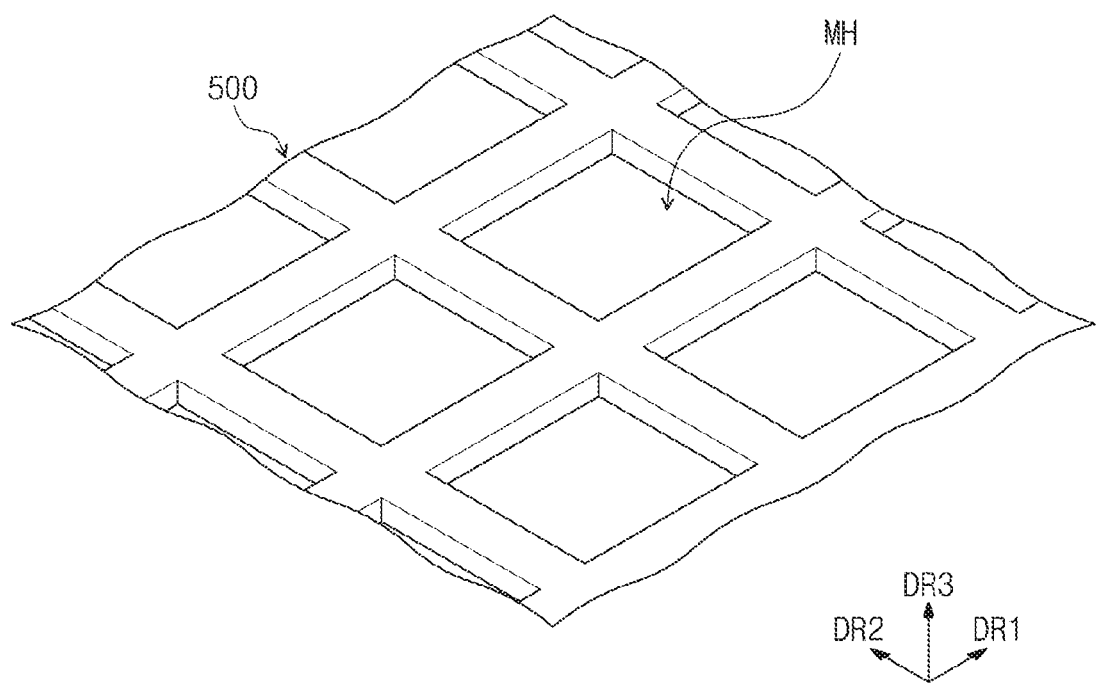
FIG. 6 is an enlarged perspective view of a second electrode part.

FIG. 4 is a perspective view of the deposition source, the evaporation chamber, the nozzles, and the ionizer of FIG. 1, and FIG. 5 is an enlarged cross-sectional view of the nozzles and the ionizer of FIG. 1. FIG. 6 is an enlarged perspective view of a second electrode part.

Referring to FIGS. 4 to 6, the ionizer IZ according to an exemplary embodiment of the inventive concepts includes a first electrode unit 400 and a second electrode unit 500. Each of the first electrode unit 400 and the second electrode unit 500 includes a metal material.

The first electrode unit 400 is disposed above the nozzles 300. The first electrode unit includes a first plate 410 and a plurality of pin electrodes 420. The first plate 410 has a plate shape parallel to a top surface of the stage STG. A plurality of nozzle holes NH may be defined in the first plate 410. The nozzle holes NH pass through the first plate 410. The nozzle holes NH are arranged in the first direction DR1. Particularly, the nozzle holes NH are arranged to pass through a center of the first plate 410 in the second direction DR2.

The nozzle holes NH overlap the nozzles 300 on the plane. At least a portion of each of the nozzles 300 is inserted into each of the nozzle holes NH. Particularly, upper portions of the nozzles 300 may be inserted to one-to-one correspond to the nozzle holes NH. According to an exemplary embodiment, the first plate 410 may be connected to the nozzles 300.

The plurality of pin electrodes 420 are disposed on the first plate 410. Each of the pin electrodes 420 extends in the third direction DR3 that is the upward direction. An end of each of the pin electrodes 420 may have a pointed shape. That is, an upper portion of each of the pin electrodes 420 may have a thickness less than that of a lower portion thereof. Although the end of each of the pin electrodes 420 is disposed at a height higher than that of the top surface of each of the nozzles 300 in FIG. 5, exemplary embodiments are not limited thereto.

The pin electrodes 420 may not be disposed on an area that overlaps the nozzle holes HN.

The second electrode unit 500 is disposed above the first electrode unit 400. That is, the second electrode unit 500 is disposed between the first electrode unit 400 and the stage STG. The second electrode unit 500 is spaced a predetermined distance from the first electrode unit 400. The second electrode unit 500 has a plate shape parallel to the first plate 410 of the first electrode unit 400.

According to an exemplary embodiment of the inventive concepts, a plurality of mesh holes MH may be defined in the second electrode unit 500. That is, the second electrode unit 500 may have a lattice shape in which stripe electrodes respectively extending in the first and second directions DR1 and DR2 cross each other. The mesh holes MH pass through the second electrode unit 500. Each of the mesh holes MH has a rectangular shape on the plane.

According to an exemplary embodiment, a voltage may be applied to each of the first electrode unit 400 and the second electrode unit 500. That is, a first electric field $EF_1$ between the first electrode unit 400 and the second electrode unit 500. A distance between an end of each of the pin electrodes 420 of the first electrode unit 400 and the second electrode unit 500 is defined as a first distance DT1.

At least a portion of the vapor particles injected from the nozzles 300 may be charged by the pin electrodes 420 of the first electrode unit 400. For example, the vapor particles, which come into contact with or are adjacent to the pin electrodes 420, of the vapor particles may give electrons to the pin electrodes 420 and thus have a positive (+) polarity.

The charged vapor particles are defined as charged particles. The charged particles pass through the mesh holes MH and then are provided to an upper side of the ionizer IZ.

According to an exemplary embodiment, the first electric field $EF_1$ may have an intensity greater than an ionization energy value of the deposition material and less than a decomposition energy value of the deposition material. When the first electric field $EF_1$ has a predetermined intensity within the above-described range, the vapor particles may be charged. For example, the first electric field $EF_1$ may have an intensity of about $10^6$ V/m to about $10^7$ V/m.

Figure 7:
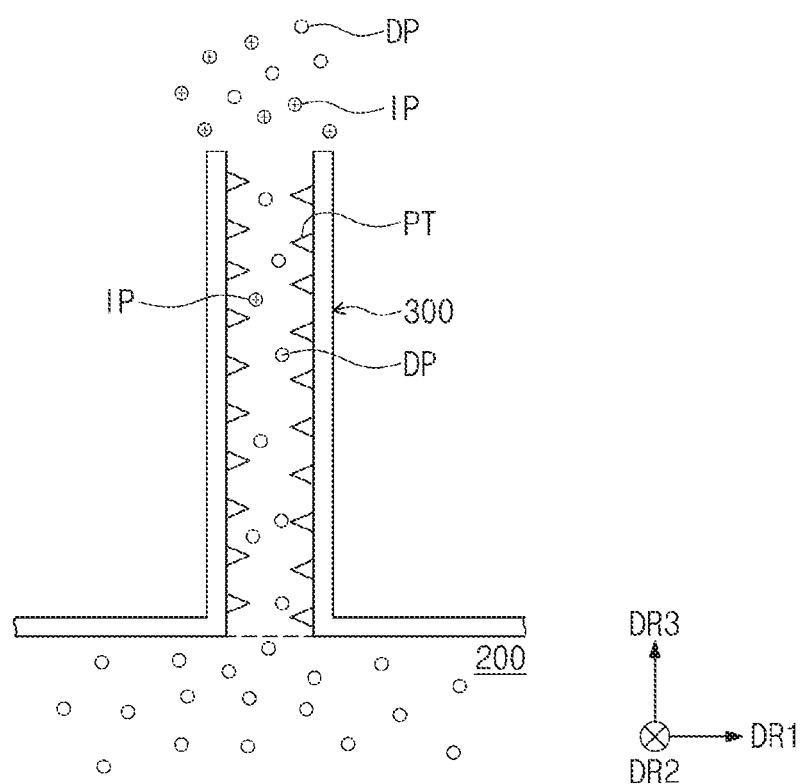
FIG. 7 is a cross-sectional view illustrating one nozzle of the nozzles of FIG. 5.
Figure 8:
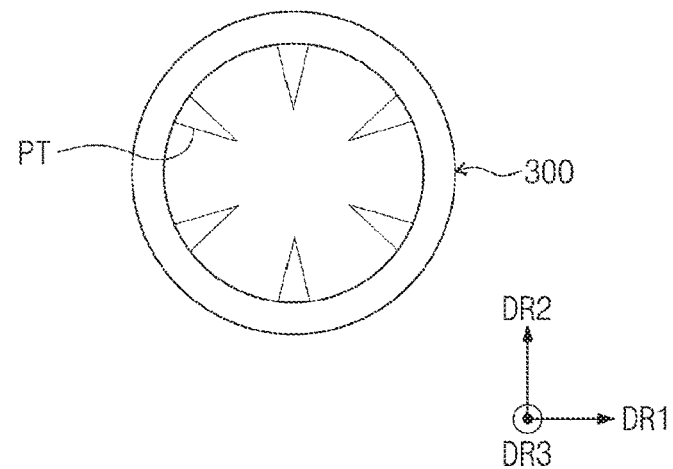
FIG. 8 is a traverse cross-sectional view of the nozzle of FIG. 7.

FIG. 7 is a cross-sectional view illustrating one nozzle of the nozzles of FIG. 5. FIG. 8 is a traverse cross-sectional view of the nozzle of FIG. 7.

Referring to FIGS. 7 and 8, each of the nozzles 300 according to an embodiment of the inventive concept includes a plurality of protrusion tips PT. The protrusion tips PT are disposed on an inner surface of each of the nozzles 300. Each of the protrusion tips PT may have a pointed shape from the inner surface of the nozzle 300 toward a center of the nozzle 300 on the plane or cross-section. The protrusion tips PT include a conductive material.

Although the protrusion tips PT are entirely arranged on an area occupied by the inner surface of the nozzle 300, the embodiment of the inventive concept is not limited thereto. For example, according to another embodiment of the inventive concept, the protrusion tips PT may be disposed to be limited to a portion of the area occupied by the inner surface of the nozzle 300. For example, the protrusion tips PT may be disposed to be limited to an area, which is adjacent to the end of the nozzle 300 injecting the deposition material, of the area occupied by the inner surface of the nozzle 300. That is, the protrusion tips PT may be disposed on only an upper area of the inner surface of the nozzle 300.

According to an exemplary embodiment, electric fields may be generated between the nozzles 300 and the second electrode unit 500, to which the voltage is applied. At least a portion of the vapor particles provided to the nozzles 300 may be charged by the protrusion tips PT disposed on the inner surface of each of the nozzles 300. For example, portions of the vapor particles DP, which comes into contact with or are adjacent to the protrusion tips PT, of the vapor particles DP may give electrons to the protrusion tips PT to have a positive (+) polarity. That is, the vapor particles DP may be converted into charged particles IP by the plurality of protrusion tips PT disposed on the inner surface of the nozzles 300. The charged particles IP may be injected from the inner space of the nozzle 300 through the nozzle 300.

Figure 9:
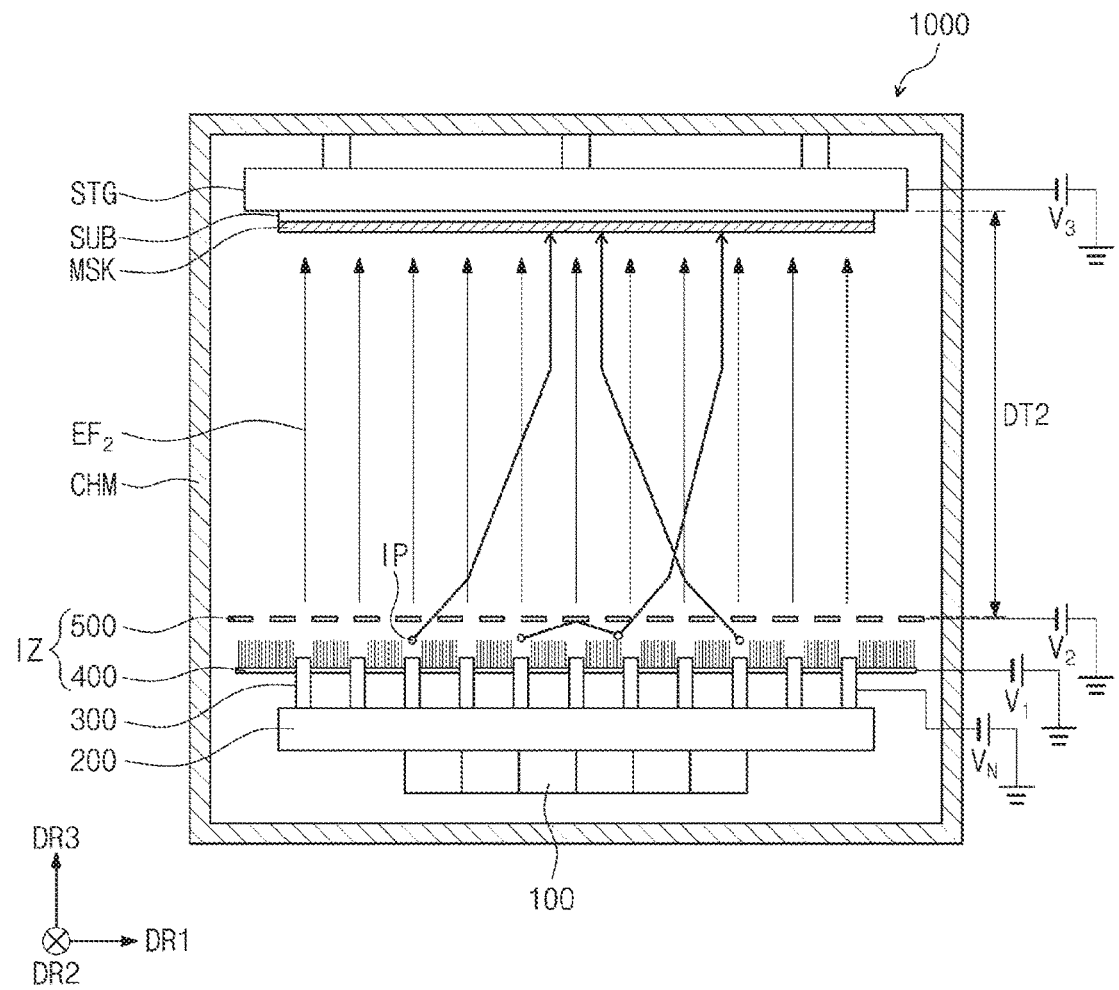
FIG. 9 is a view illustrating a moving path of a deposition material according to an exemplary embodiment of the inventive concepts.

FIG. 9 is a view illustrating a moving path of the deposition material according to an exemplary embodiment of the inventive concepts.

A principle of the deposition of the deposition material of the deposition source 100 on the target substrate SUB will be described with reference to FIG. 9.

According to this embodiment, a voltage may be applied to each of the nozzles 300, the electrode units 400 and 500 of the ionizer IZ, and the stage STG.

Particularly, a charging voltage $V_N$ is applied to the nozzles 300.

A first voltage $V_1$ is applied to the first electrode unit 400.

A second voltage $V_2$ is applied to the second electrode unit 500.

A third voltage $V_3$ is applied to the stage STG.

According to an exemplary embodiment, the nozzles 300 are electrically connected to the first electrode unit 400. Thus, the charging voltage $V_N$ may have the same intensity as that first voltage $V_1$. For example, each of the charging voltage $V_N$ and the first voltage $V_1$ may have an intensity of about 90 V or about 110 V.

Although not shown, when the nozzles 300 and the first electrode unit 400 are spaced apart from each other, the charging voltage $V_N$ may have an intensity different from that of the first voltage $V_1$. According to the inventive concept, the intensity relationship between the charging voltage $V_N$ and the first voltage $V_1$ is not particularly limited.

The second voltage $V_2$ may be less than each of the charging voltage $V_N$ and the first voltage $V_1$. For example, the second voltage $V_2$ may have an intensity of about 40 V to about 60 V.

Thus, the first electric field $EF_1$ (see FIG. 5) may be generated between the nozzles 300 and the second electrode unit 500 and between the first electrode unit 400 and the second electrode unit 500. The vapor particles DP (see FIG. 7) moving to each of the inner space of each of the nozzles 300 and the space between the first electrode unit 400 and the second electrode unit 500 may be charged by the first electronic field $EF_1$ (see FIG. 5) and thus converted into the charged particles IP. The charged particles IP pass through the mesh holes MH (see FIG. 6) of the second electrode unit 500 to move upward.

The third voltage $V_3$ may be less than the second voltage $V_2$. For example, the third voltage $V_3$ may have an intensity of about 1 V to about 20 V.

Thus, a second electric field $EF_2$ may be generated between the second electrode unit 500 and the stage STG. The second electric field $EF_2$ may have an intensity less than that of the first electric field $EF_1$. For example, the second electric field $EF_2$ may have an intensity of about 10V/m to about 100V/m. A spaced distance between the second electrode unit 500 and the stage STG is defined as a second distance DT2. The second distance DT2 is greater than the first distance DT1. Also, the second distance DT2 may be greater than a distance between each of the nozzles and the second electrode unit 500.

The charged particles IP passing through the second electrode unit 500 move toward the stage STG. According to this embodiment, the charged particles IP having the positive (+) polarity may move along the direction of the second electric field $EF_2$. As described above, the second electric field $EF_2$ is parallel to the third direction DR3.

The charged particles IP move along the direction of the second electric field $EF_2$ and then are deposited on the target substrate SUB.

Figure 10:
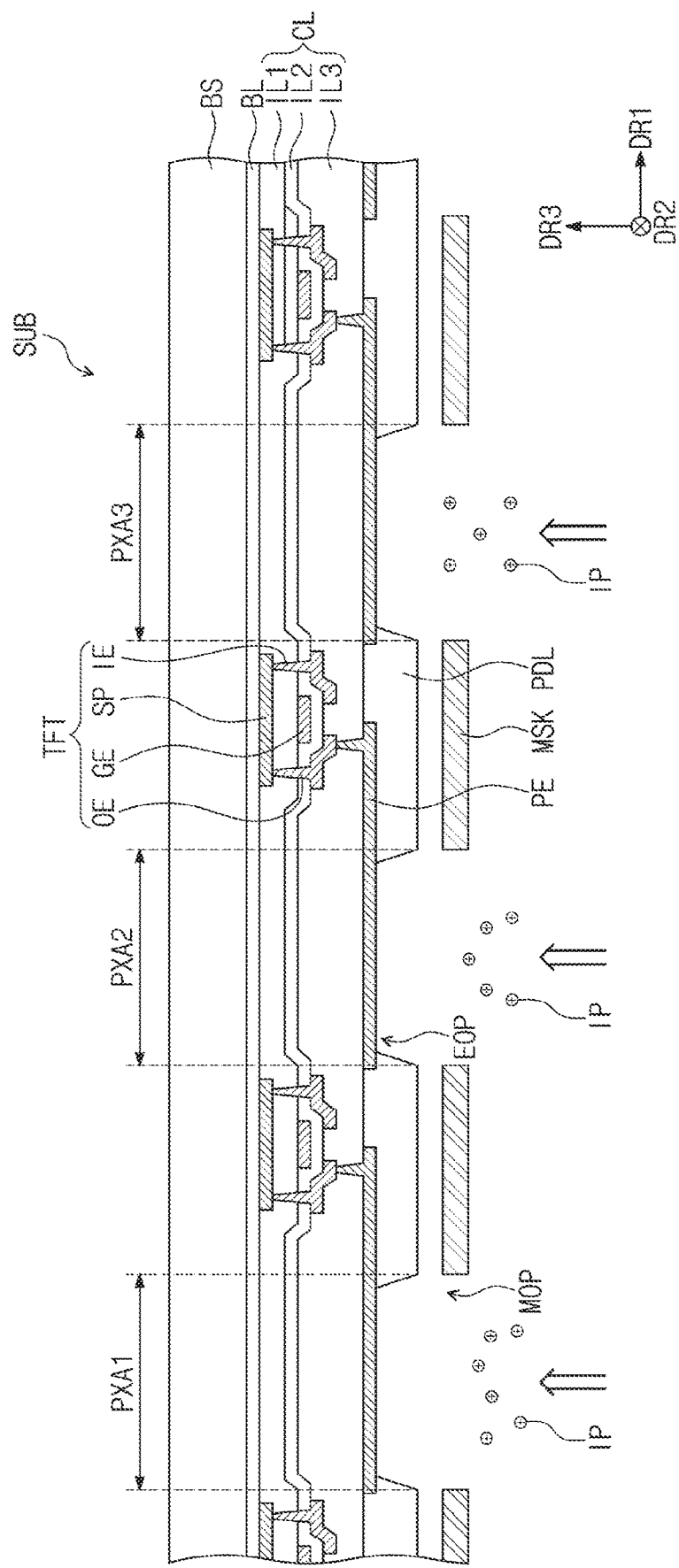
FIG. 10 is an enlarged view of a target substrate according to an exemplary embodiment.
Figure 11:
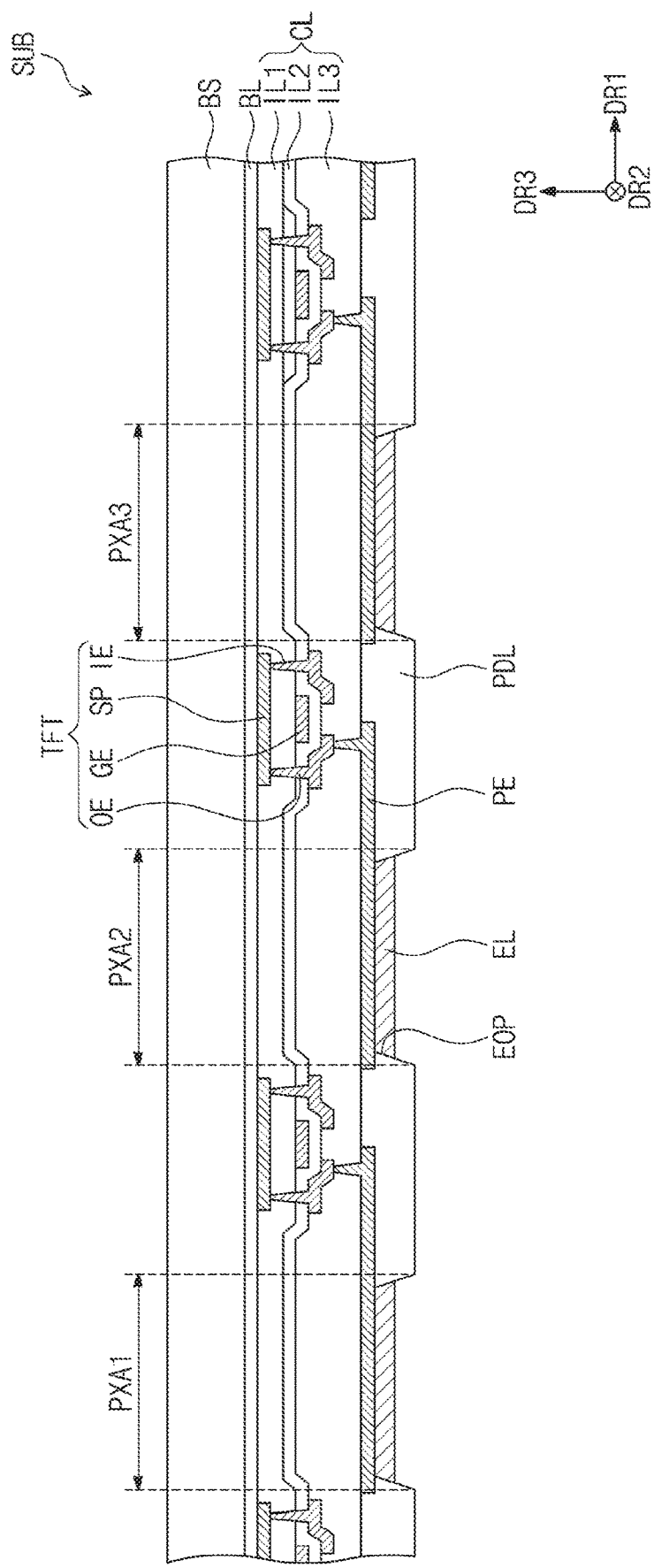
FIG. 11 is an enlarged view of the target substrate on which deposition is completed.

FIG. 10 is an enlarged view of the target substrate according to an exemplary embodiment, and FIG. 11 is an enlarged view of the target substrate on which the deposition is completed.

FIGS. 10 and 11 illustrate an example of a configuration of the target substrate so as to explain a use of the deposition apparatus 1000 according to an exemplary embodiment. That is, the use of the deposition apparatus 1000 according to the inventive concept is not specifically limited to the kind of target substrate SUB.

Referring to FIGS. 10 and 11, the target substrate SUB according to an exemplary embodiment may be a portion of the organic light emitting display panel. Hereinafter, the configuration of the target substrate will be described in more detail.

The target substrate SUB includes a base layer BS, a functional layer BL, and a circuit layer CL. The base layer BS defines a rear surface of the target substrate SUB. The base layer BS may be a base layer for forming the electrodes and the display elements of the target substrate SUB. The base layer BS may be provided in the form of a substrate. The base layer BS may entirely contact the stage STG (see FIG. 7).

The functional layer BL is disposed on the base layer BS. The functional layer BL may include a barrier layer and/or a buffer layer. The functional layer BL may prevent oxygen or moisture introduced through the base layer BS from being permeated into the circuit layer CL and allow the circuit layer CL to be stably formed on the base layer BS. In this specification, a kind of materials of the functional layer BL is not specifically limited. According to another exemplary embodiment of the inventive concepts, the functional layer BL may be omitted.

The circuit layer CL is disposed on the base layer BS. The circuit layer CL may include a plurality of thin film transistors TFT for driving the organic light emitting elements OLED and a plurality of signal lines (not shown). FIGS. 10 and 11 illustrates only thin film transistors TFT, which are directly connected to the organic light emitting element, of the plurality of thin film transistors of the circuit layer CL, and thus, configurations of the thin film transistors TFT will be described later as an example.

Each of the thin film transistors TFT includes a semiconductor pattern SP, a control electrode GE, an input electrode IE, and an output electrode OE. The semiconductor pattern SP may include a semiconductor material. The control electrode CE is spaced apart from the semiconductor pattern SP with a first insulation layer IL1 therebetween.

The input electrode IE and the output electrode OE may be spaced apart from the control electrode GE with a second insulation layer IL2 therebetween. The input electrode IE and the output electrode OE are connected to one side and the other side of the semiconductor pattern SP through the first insulation layer IL1 and the second insulation layer IL2, respectively.

A third insulation layer IL3 may be disposed on the second insulation layer IL2 to cover the input electrode IE and the output electrode OE. In the thin film transistor TFT, the semiconductor pattern SP may be disposed on the control electrode GE. Alternatively, the semiconductor pattern SP may be disposed on the input electrode IE and the output electrode OE. Alternatively, the input electrode IE and the output electrode OE may be disposed on the same layer and be directly connected to the semiconductor pattern SP. The thin film transistor TFT according to exemplary embodiments may have various structures and also be limited to a specific embodiment.

The pixel electrodes PE and the pixel defining layer PDL are disposed on the pixel layer CL. The pixel electrode PE may pass through the third insulation layer IL3 and be connected to the thin film transistor TFT. The pixel defining layer PDL is disposed on the third insulation layer IL3 and the pixel electrodes PE. Deposition openings EOP may be defined in the pixel defining layer PDL. The deposition openings EOP may expose at least a portion of an area of each of the pixel electrodes PE. The exposed areas of the pixel electrodes PE may be defined as pixel areas PXA1, PXA2, and PXA3. The plurality of pixel areas PXA1, PXA2, and PXA3 may define a display area of the organic light emitting display panel.

As illustrated in FIG. 10, a plurality of mask openings MOP are defined in the mask MSK. The mask openings MOP may overlap to one-to-one correspond to the deposition openings EOP on the plane. That is, the mask openings MOP overlap the pixel areas PXA1, PXA2, and PXA3.

According to an exemplary embodiment of the inventive concepts, the charged particles IP charged by the nozzles 300 and the ionizer IZ move toward the stage STG, i.e., the target substrate SUB. The charged particles IP may pass through the mask openings MOP of the mask MSK and then be deposited on the pixel areas PXA1 to PXA3 on the target substrate SUB.

As illustrated in FIG. 11, the deposited deposition materials form the light emitting layer EL on the pixel areas PXA1, PXA2, and PXA3. The light emitting layer EL is disposed on each of the pixel electrodes PE. Although not shown, after the light emitting layer EL is completely formed, a common electrode (not shown) is formed on the light emitting layer EL to manufacture a display substrate of the display panel.

Unlike an exemplary embodiment of the inventive concepts, when the vapor particles are not charged, or electric fields are not generated between the ionizer IZ and the stage STG, the vapor particles injected from the nozzles 300 may not be uniformly provided to the target substrate SUB. Particularly, in the case of the pixel areas defined on an edge of the target substrate SUB, an angle between a normal line of the top surface of the target substrate SUB and the direction in which the vapor particles are incident may be relatively small. That is, when the vapor particles are obliquely incident into the target substrate SUB, a portion of the vapor particles incident into the pixel areas PXA defined on an edge area of the target substrate SUB may be blocked by the mask MSK. In this case, the vapor particles may not deposited on a partial area of the pixel areas PXA. However, according to an exemplary embodiment of the inventive concepts, the vapor particles DP (see FIG. 7) are changed with respect to each of the nozzles 300 and the ionizer IZ, and the charged particles IP move to the space between the ionizer IZ and the stage STG, in which the second electric field $EF_2$ is generated. The moving direction of the charged particles IP may be changed into a space that is adjacent to the third direction DR3 by the second electric field $EF_2$. Particularly, the charged particles IP may be reduced in angle between the moving direction of the charged particles IP and the direction of the second electric field $EF_2$ due to the influence of the second electric field $EF_2$. The angle may be about 10 degrees or less. That is, according to the this embodiment, an angle θ of the charged particles IP with respect to the top surface of the stage STG may be about 80 degrees to about 100 degrees. In this embodiment, the top surface of the stage STG has a top surface parallel to the top surface of the target substrate SUB and top and bottom surfaces of the mask MSK. As a result, according to this embodiment of the inventive concept, since the charged particles IP are incident into the pixel areas PXA1 to PXA3 on the target substrate SUB in the direction adjacent to the third direction DR3, the deposition material may be uniformly deposited on the target substrate SUB. That is, the organic light emitting display device may be improved in yield.

Also, according to an exemplary embodiment, a voltage may be applied to each of the nozzles 300, and the plurality of protrusion tips PT may be disposed on the inner surface of each of the nozzles 300, charging efficiency of the deposition material may be improved.

Figure 12:
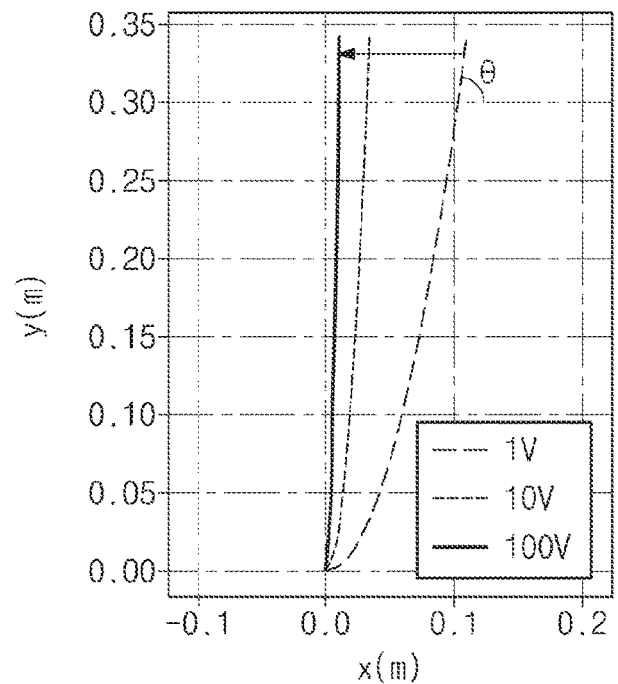
FIG. 12 is a graph illustrating a path of the deposition material depending on an intensity of a second electric field.
Figure 13:
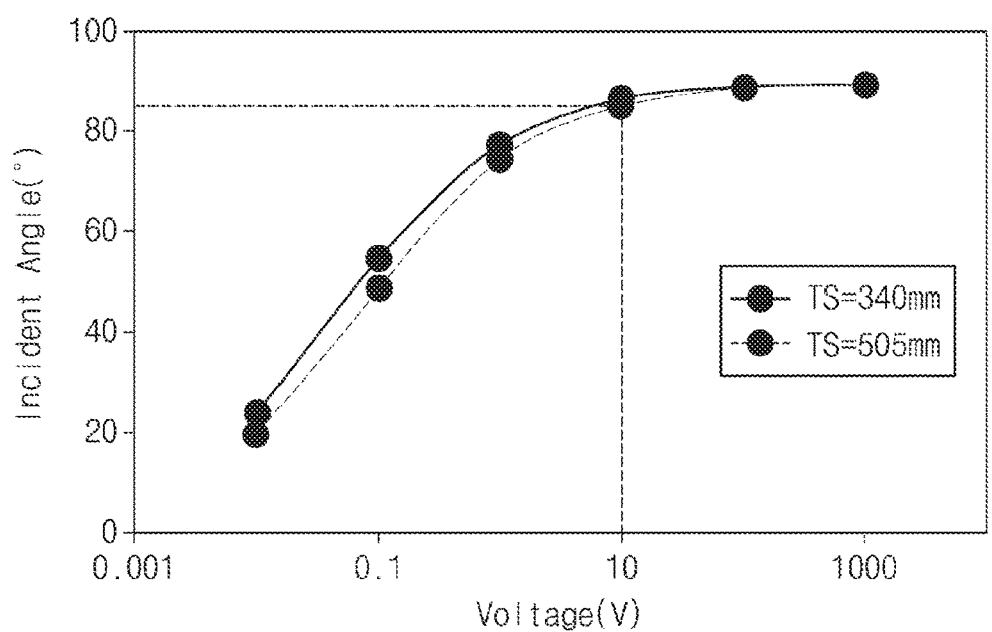
FIG. 13 is a graph illustrating an incident angle of the deposition material depending on the intensity of the second electric field.

FIG. 12 is a graph illustrating a path of the deposition material depending on an intensity of the second electric field, and FIG. 13 is a graph illustrating an incident angle of the deposition material depending on the intensity of the second electric field.

According to an exemplary embodiment of the inventive concepts, as the second electric field $EF_2$ generated between the stage STG and the second electrode unit 500 increases in intensity, i.e., a potential difference between the stage STG and the second electrode unit 500 significantly increase, the moving direction of the vapor particles may be adjacent to the third direction DR3 (see FIG. 9). That is, as the potential difference between the stage STG and the second electrode unit 500 increases, an incident angle θ that is defined as the angle between the top surface of the stage STG and the moving direction of the vapor particles may increase.

As illustrated in FIG. 12, when the potential difference is about 10 V, the incident angle θ of the vapor particles increases in comparison to the case in which the potential difference is about 1 V. Also, when the potential difference is about 100 V, the incident angle θ increases in comparison to the case in which the potential difference is about 10 V. According to an exemplary embodiment, when the potential difference is about 10 V or more, the incident angle θ of the vapor particles may be about 80 degrees to about 100 degrees.

Also, as illustrated in FIG. 13, as the second distance TS decreases, the incident angle θ may increase. When the distance TS in the third direction DR3 (see FIG. 9) in which the second electric field $EF_2$ is generated, i.e., between the stage STG and the second electrode unit 500 is about 340 mm to about 505 mm, and the potential difference is about 10 V or more, the incident angle θ of the vapor particles may be about 80 degrees to about 100 degrees.

Figure 14:
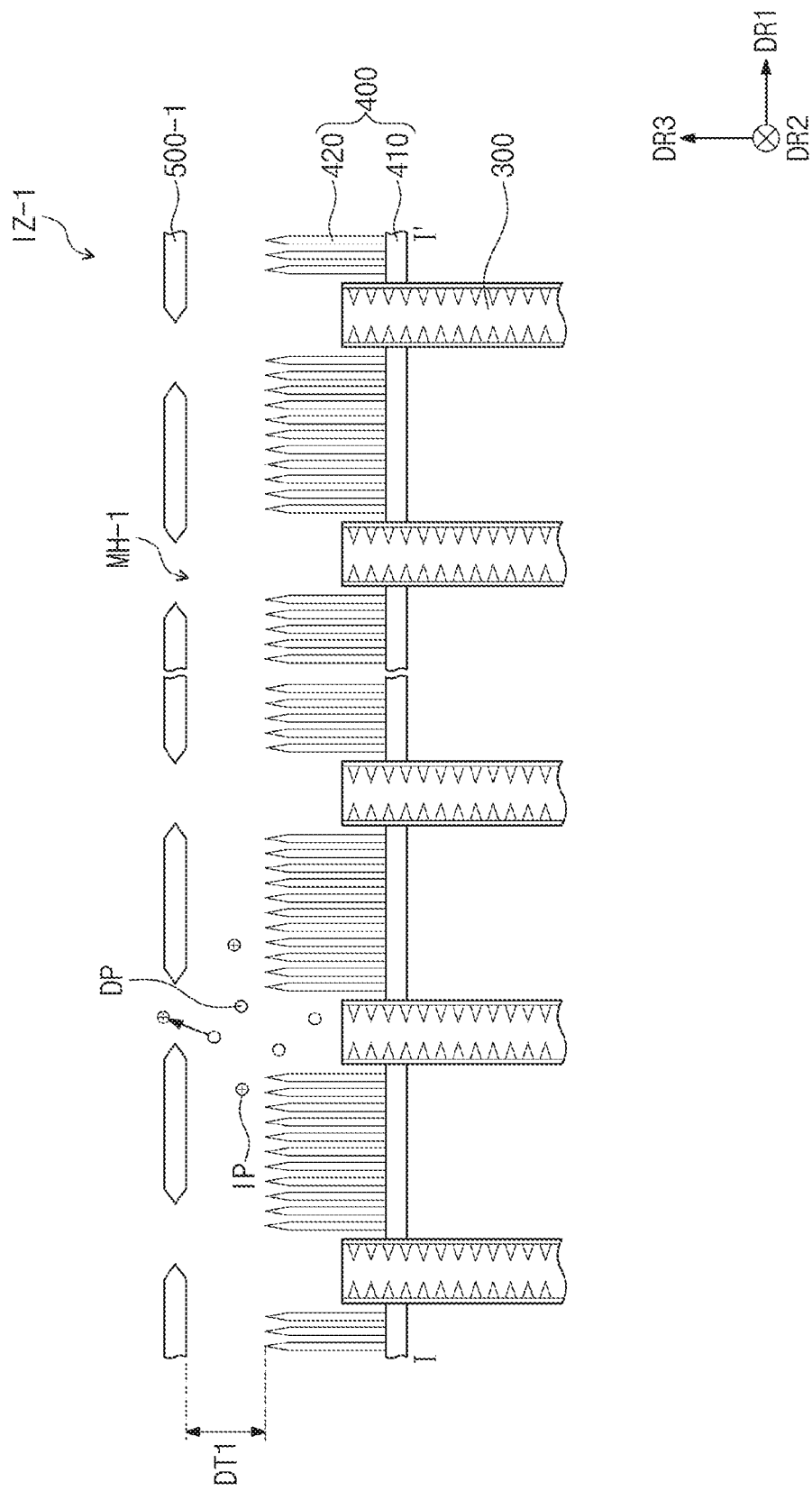
FIG. 14 is an enlarged cross-sectional view of an ionizer according to another exemplary embodiment of the inventive concepts.
Figure 15:
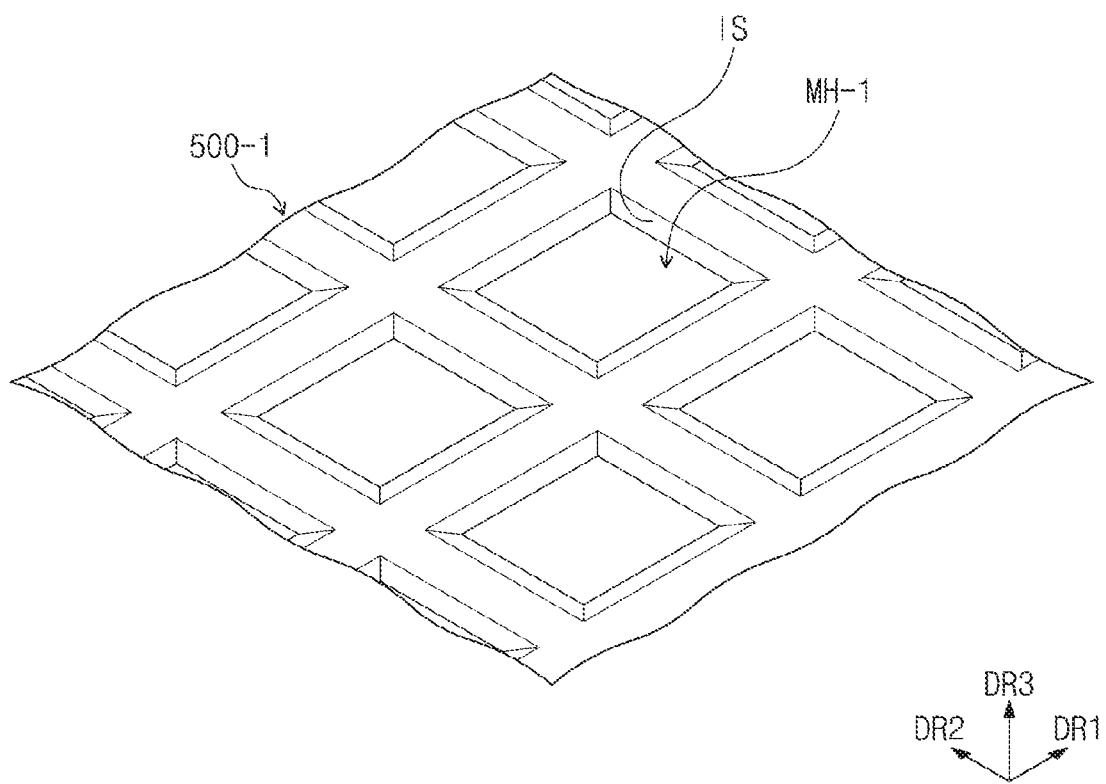
FIG. 15 is an enlarged view of a second electrode unit of FIG. 14.

FIG. 14 is an enlarged cross-sectional view of an ionizer according to another exemplary embodiment of the inventive concepts, and FIG. 15 is an enlarged view of a second electrode unit of FIG. 14.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIGS. 14 and 15, a plurality of mesh holes MH-1 may be defined in a second electrode unit 500-1 of an ionizer IZ-1 according to another exemplary embodiment. The mesh holes MH-1 pass through the second electrode unit 500-1. Each of the mesh holes MH-1 has a rectangular shape on the plane.

According to this embodiment, an inner surface of each of the mesh holes MH has a cross-sectional shape pointed toward a center of each of the mesh holes MH-1. That is, the inner surface of each of the mesh holes MH-1 may include at least one inclined surface IS.

According to this embodiment, partial vapor particles DP, which are not charged in an inner space of each of nozzles 300 or a space between pin electrodes 420 and the second electrode unit 500-1, of vapor particles DP provided from nozzles 300 may be charged to the inclined surface IS of the inner surface of the mesh holes MH-1 of the second electrode unit 500-1. For example, the partial vapor particles DP, which come into contact with or are adjacent to the inclined surface IS, of the vapor particles DP may give electrons to a second electrode unit 500-1 to have a positive (+) polarity.

Thus, according to this embodiment, charging efficiency of a deposition material may be more improved.

Figure 16:
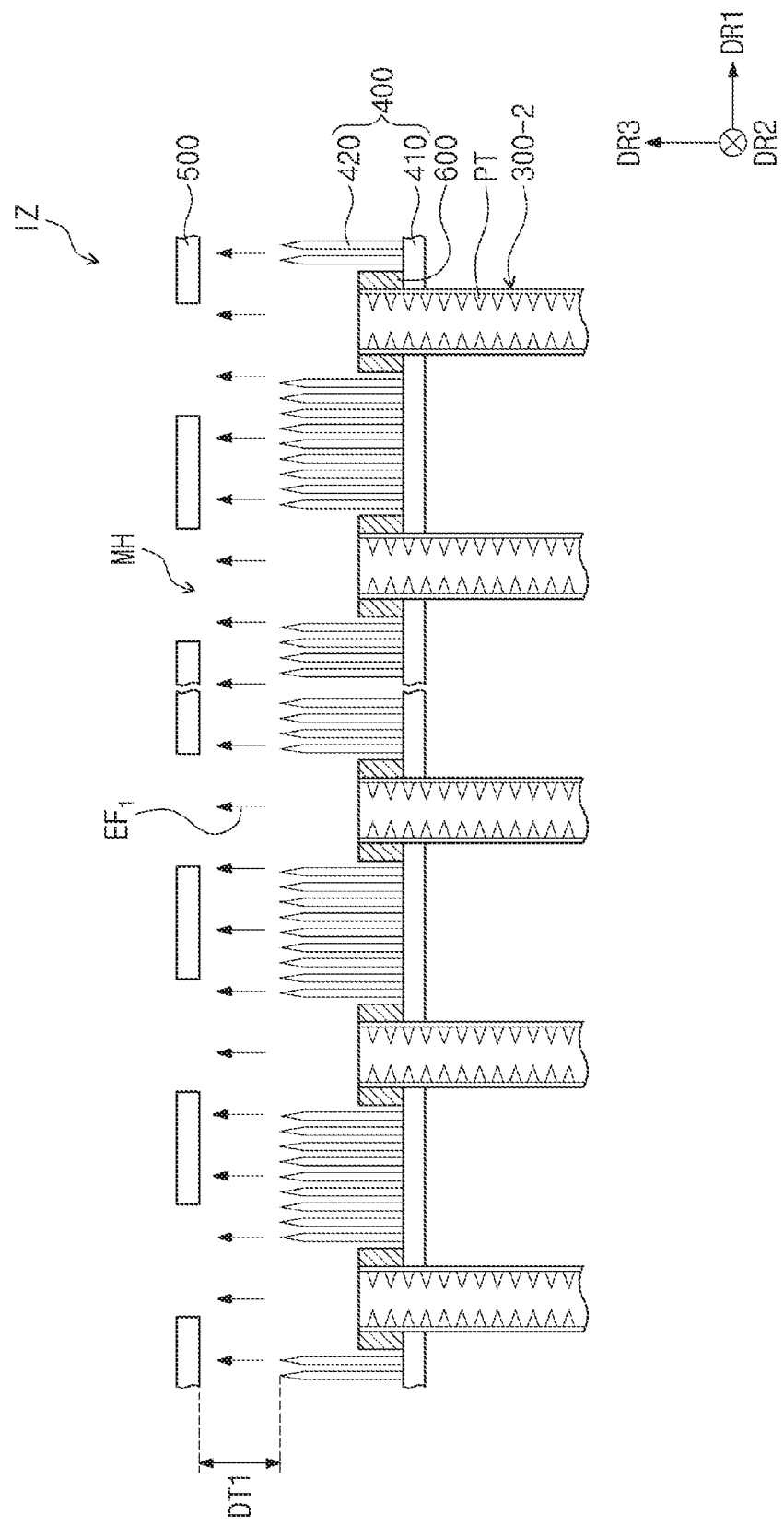
FIG. 16 is an enlarged cross-sectional view of an ionizer according to another exemplary embodiment of the inventive concepts.

FIG. 16 is an enlarged cross-sectional view of an ionizer according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 16, a deposition apparatus according to another exemplary embodiment further includes a plurality of sub heating members 600.

The sub heating members 600 are disposed to surround the nozzles 300. The sub heating members 600 are disposed to one-to-one correspond to the nozzles 300. Particularly, each of the sub heating members 600 is disposed to surround an outer surface of each of the nozzles 300. Each of the sub heating members 600 are adjacent to an end of the nozzle 300.

Exemplary embodiments are not specifically limited to the shape and the arrangement relationship of the sub heating members 600. For example, according to another exemplary embodiment, each of the sub heating members 600 may have a shape entirely surrounding the outer surface of each of the nozzles 300 or be disposed in an inner space of each of the nozzles 300.

According to this embodiment, the sub heating members 600 may be disposed adjacent to upper portions of the nozzles 300 to heat the inner spaces of the nozzles 300. Thus, vapor particles may be prevented from being accumulated in the inner spaces of the nozzles 300 or around the nozzles 300.

Figure 17:
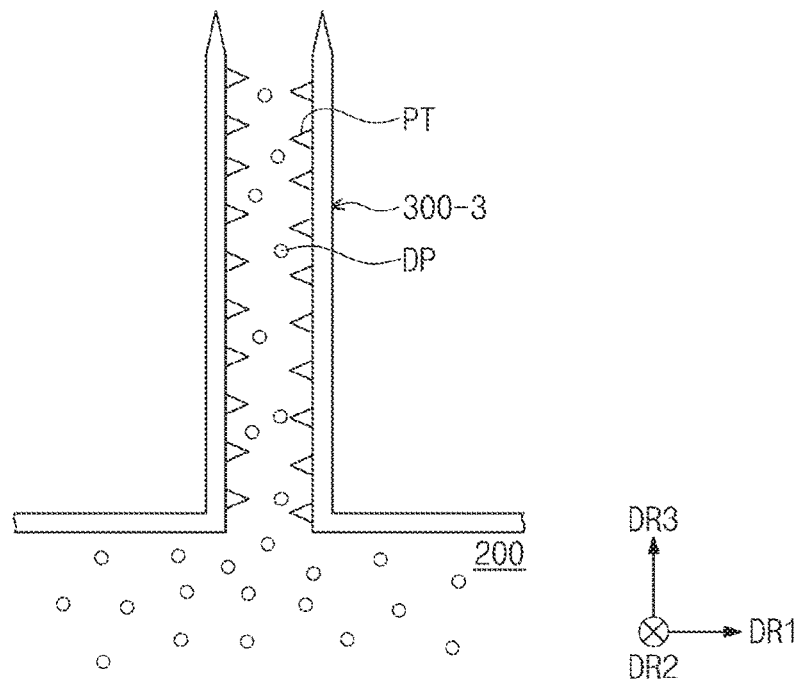
FIG. 17 is a cross-sectional view of a nozzle according to another exemplary embodiment of the inventive concepts.
Figure 18:
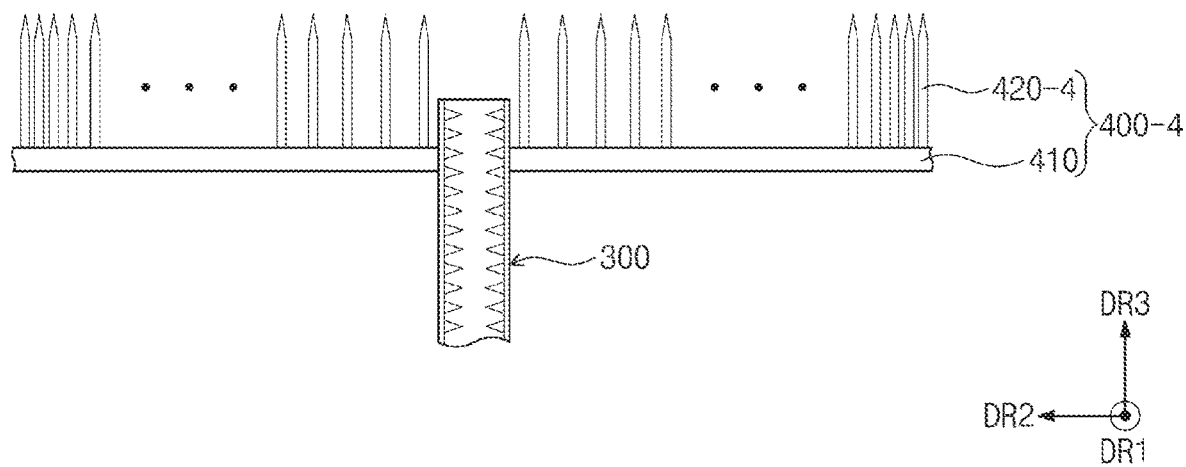
FIG. 18 is an enlarged cross-sectional view of an ionizer according to another exemplary embodiment of the inventive concepts.
Figure 19:
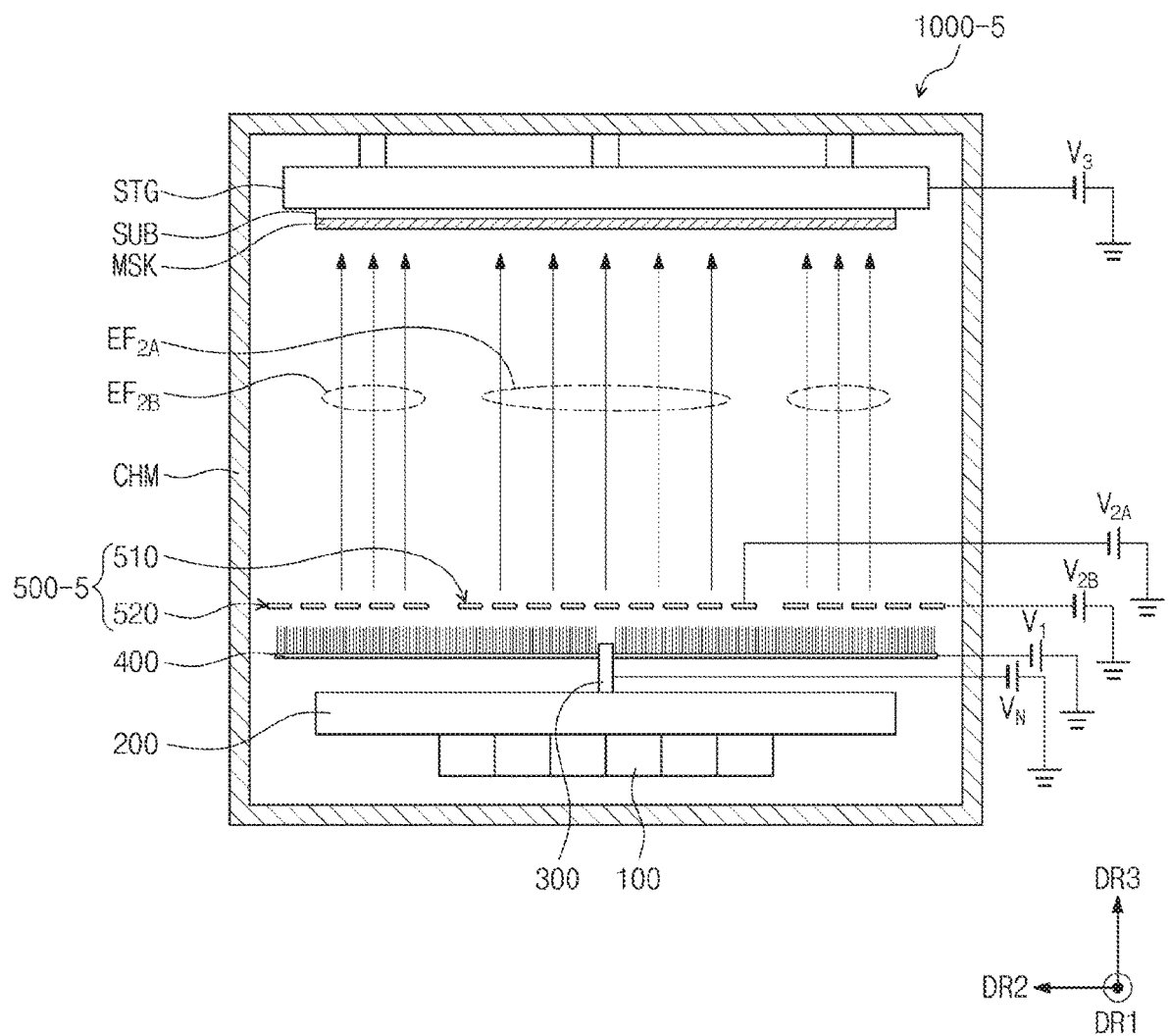
FIG. 19 is a cross-sectional view of a deposition apparatus according to another exemplary embodiment of the inventive concepts.

FIG. 17 is a cross-sectional view of a nozzle according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 17, a top surface of each of nozzles 300-3 according to another exemplary embodiment may have a shape pointed in the third direction DR3 that is the upward direction on a cross-section. According to this embodiment, vapor particles DP injected from the nozzles 300-3 may be charged by the pointed shape of the top surface of each of the nozzles 300-3. The vapor particles DP may be injected through the nozzles 30-3 and also provide electrons to the nozzles 300-3 to have a positive (+) polarity.

According to this embodiment, charging efficiency of a deposition material may be more improved.

FIG. 18 is an enlarged cross-sectional view of an ionizer according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 18, a first electrode unit 400-4 according to another exemplary embodiment includes a first plate 410 and a plurality of pin electrodes 420-4. Since the first plate 410 has the same configuration as the above-described first plate 410 of FIGS. 4 and 5, its detailed description will be omitted.

The pin electrodes 420-4 are disposed on the first plate 410. Each of the pin electrodes 420-4 extends in the third direction DR3 that is the upward direction.

According to this embodiment, when the pin electrodes 420-4 are adjacent to nozzles 300 on the first plate 410, density may be reduced. Particularly, a distance between the pin electrodes 420-4 in a region adjacent to the nozzles 300 may increase, and a distance between the pin electrodes 420-4 in a direction that is away from the nozzles 300 in the second direction DR2 may decrease.

In general, the vapor particles in the region adjacent to the nozzles 300 may have a density greater than that of the vapor particles in a region that is not adjacent to the nozzles 300. According to this embodiment, a distance between the pin electrodes 420-4 in a region in which the vapor particles are not relatively diffused, i.e., a region that is not adjacent to the nozzles 300 may be less than that between the pin electrodes 420-4 in a region in which the density of the vapor particles is relatively high, i.e., a region that is relatively adjacent to the nozzles 300. Thus, even though the vapor particles injected through the nozzles 300 have different densities for each region, charging efficiency due to the pin electrodes 420-4 are different for each region. Thus, the deposition apparatus may be more improved in deposition uniformity.

FIG. 19 is a cross-sectional view of a deposition apparatus according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 19, a second electrode unit 500-5 of a deposition apparatus 1000-5 according to another exemplary embodiment may include a plurality of electrodes 510 and 520, each of which has a plate shape.

Particularly, the second electrode unit 500-5 includes a first mesh electrode 510 and a plurality of second mesh electrodes 520. Although not shown, a plurality of mesh holes MH (see FIG. 6) may be defined in each of the first mesh electrode 510 and the second mesh electrodes 520.

The first mesh electrode 510 and the second mesh electrodes 520 may be spaced apart from each other on the plane. In this embodiment, the first mesh electrode 510 and the second mesh electrodes 520 are disposed on the same plane. That is, a distance between the first mesh electrode 510 and a stage STG is the same as that between each of the second mesh electrodes 520 and the stage STG.

The first mesh electrode 510 may have a plate shape extending in the first direction DR1 on the plane. The first mesh electrode 510 may overlap a central portion of the stage STG on the plane. The first mesh electrode 510 may overlap the nozzles 300 on the plane.

Each of the second mesh electrodes 520 has a plate shape extending in the first direction DR1 on the plane. The second mesh electrodes 520 are arranged with the first mesh electrode 510 therebetween in the second direction DR2. The second mesh electrodes 520 may overlap a peripheral portion of the stage STG on the plane. The second mesh electrodes 520 do not overlap the nozzles 300 on the plane.

According to this embodiment, a voltage $V_{2A}$ applied to the first mesh electrode 510 may be less than that $V_{2B}$ applied to each of the second mesh electrodes 520. That is, a first sub electric field generated between the first mesh electrode 510 and the first electrode unit 400 may have an intensity less than that of a second sub electric field generated between each of the second mesh electrodes 520 and the first electrode unit 400. An electric field $EF_{2A}$ generated between the first mesh electrode 510 and the stage STG may have an intensity greater than that of an electric field $EF_{2B}$ generated between each of the second mesh electrodes 520 and the stage STG.

According to this embodiment, an electric field in a region in which the vapor particles has a relatively low density, i.e., a region that is not relatively adjacent to the nozzles 300 in the ionizer IZ has an intensity greater than that of an electric field in a region in which the vapor particles have a relatively high density, i.e., a region that is adjacent to the nozzles 300. Thus, even though the vapor particles injected through the nozzles 300 have different densities for each region, charging efficiency due to the pin electrodes are different for each region. Thus, the deposition apparatus may be more improved in deposition uniformity.

Figure 20:
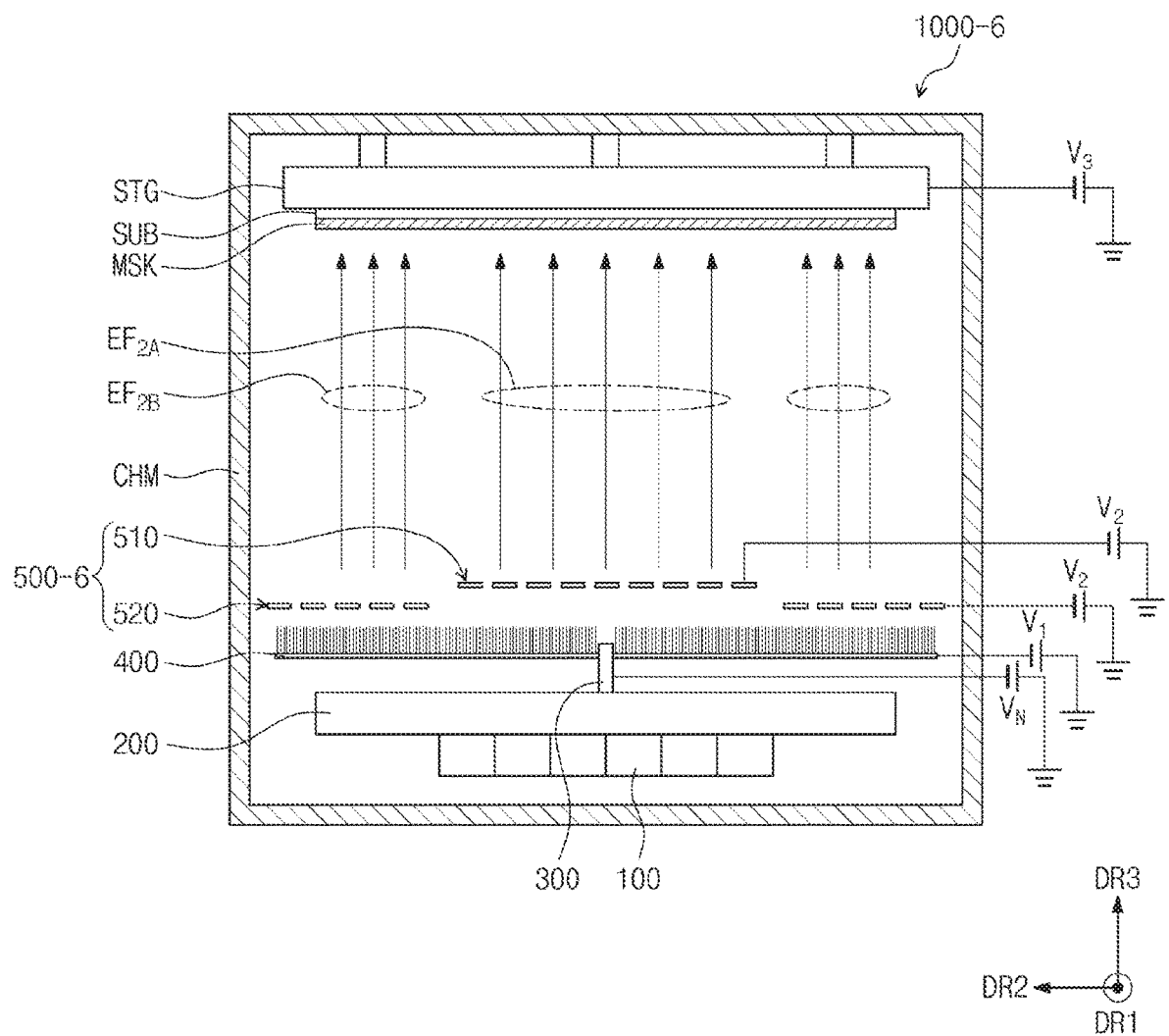
FIG. 20 is a cross-sectional view of a deposition apparatus according to another exemplary embodiment of the inventive concepts.

FIG. 20 is a cross-sectional view of a deposition apparatus according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 20, a second electrode unit 500-6 of an deposition apparatus 1000-6 according to another exemplary embodiment includes a first mesh electrode 510 and a plurality of second mesh electrodes 520.

The first mesh electrode 510 and the second mesh electrodes 520 may be spaced apart from each other on the plane. In this embodiment, the same voltage $V_2$ may be applied to the first mesh electrode 510 and the second mesh electrodes 520.

According to this embodiment, the first mesh electrode 510 may be disposed higher than the second mesh electrodes 520. That is, a distance between the first mesh electrode 510 and the first electrode unit 400 may be greater than that between each of the second mesh electrodes 520 and the first electrode unit 400. A distance between the first mesh electrode 510 and a stage STG is less than that between each of the second mesh electrodes 520 and the stage STG.

Thus, a first sub electric field generated between the first mesh electrode 510 and the first electrode unit 400 may have an intensity less than that of a second sub electric field generated between each of the second mesh electrodes 520 and the first electrode unit 400. An electric field $EF_{2A}$ generated between the first mesh electrode 510 and the stage STG may have an intensity greater than that of an electric field $EF_{2B}$ generated between each of the second mesh electrodes 520 and the stage STG.

According to this embodiment, an electric field in a region in which the vapor particles has a relatively low density, i.e., a region that is not relatively adjacent to the nozzles 300 in the ionizer IZ has an intensity greater than that of an electric field in a region in which the vapor particles have a relatively high density, i.e., a region that is adjacent to the nozzles 300. Thus, even though the vapor particles injected through the nozzles 300 have different densities for each region, charging efficiency due to the pin electrodes are different for each region. Thus, the deposition apparatus may be more improved in deposition uniformity.

Figure 21:
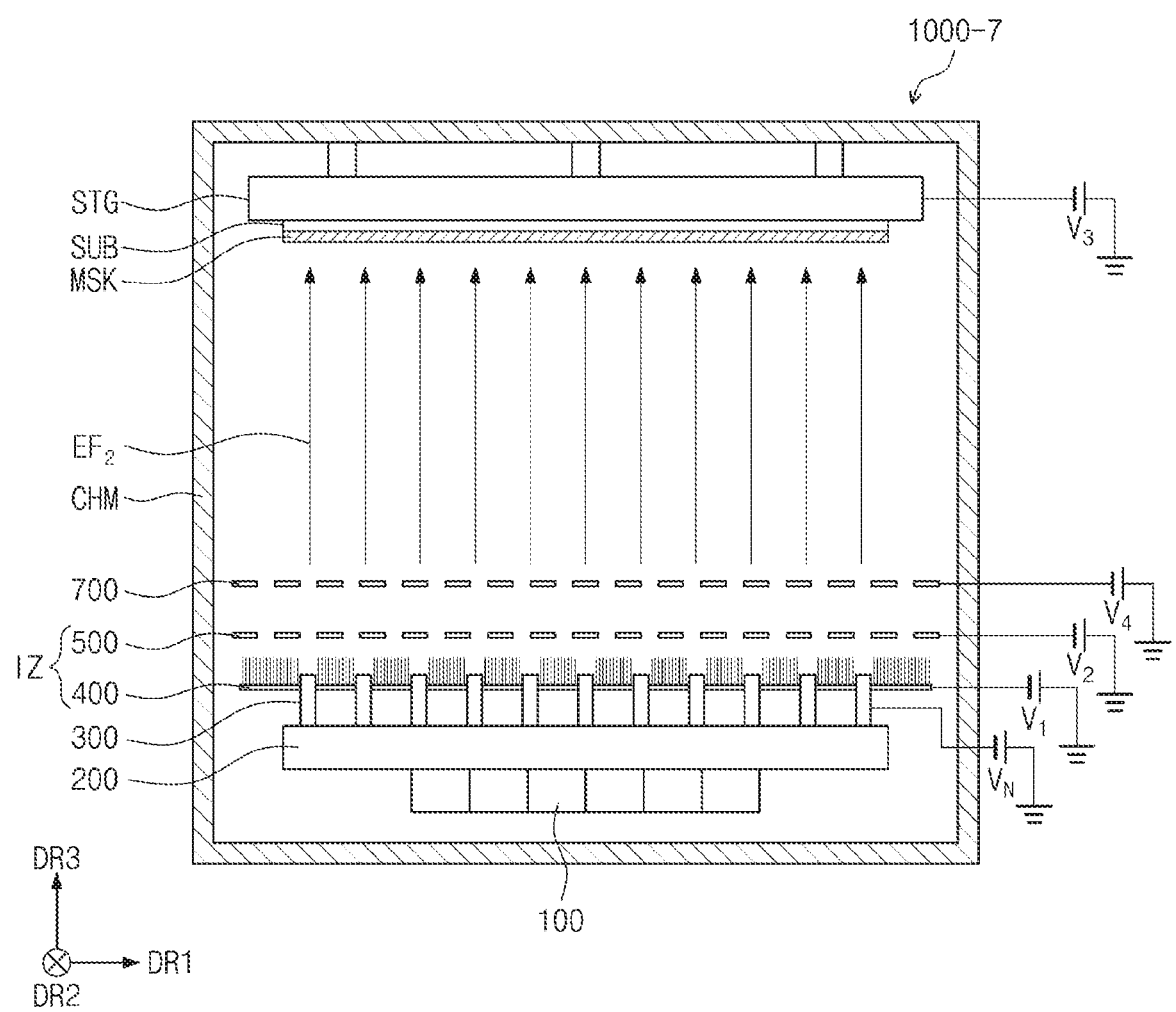
FIG. 21 is a cross-sectional view of a deposition apparatus according to another exemplary embodiment of the inventive concepts.

FIG. 21 is a cross-sectional view of a deposition apparatus according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIG. 21, a deposition apparatus 1000-7 according to another exemplary embodiment further include a third electrode unit 700 disposed between an ionizer IZ and a stage STG. The third electrode unit 700 may have a plate shape. Although not shown, the third electrode unit 700 includes a plurality of holes (not shown) defined in the plane. Charged particles provided from the ionizer IZ may pass through holes (not shown) to move toward the stage STG.

Exemplary embodiments are not specifically limited to the shape and number of holes (not shown). For example, the holes (not shown) of the third electrode unit 700 may have the same shape as each of the mesh holes MH of the above-described second electrode unit 500 (see FIG. 6).

According to an exemplary embodiment, a fourth voltage $V_4$ may be applied to the third electrode unit 700. The fourth voltage $V_4$ may be equal to or less than the second voltage $V_2$ and greater than the third voltage $V_3$.

When the fourth voltage $V_4$ is equal to the second voltage $V_2$, the first electric field $EF_1$ (see FIG. 5) may be generated between the nozzles 300 and the second electrode unit 500 and between the first electrode unit 400 and the second electrode unit 500, and the second electric field $EF_2$ may be generated between the third electrode unit 700 and the stage STG. An electric field may not be generated between the second electrode unit 500 and the third electrode unit 700.

Although not shown, when the fourth voltage $V_4$ is less than the second voltage $V_2$, a third electric field (not shown) may be generated between the second electrode unit 500 and the third electrode unit 700. A direction of the fourth electric field (not shown) is parallel to the third direction DR3 toward the stage STG. In an exemplary embodiment, the intensity of the fourth electric field (not shown) is not specifically limited.

Figure 22:
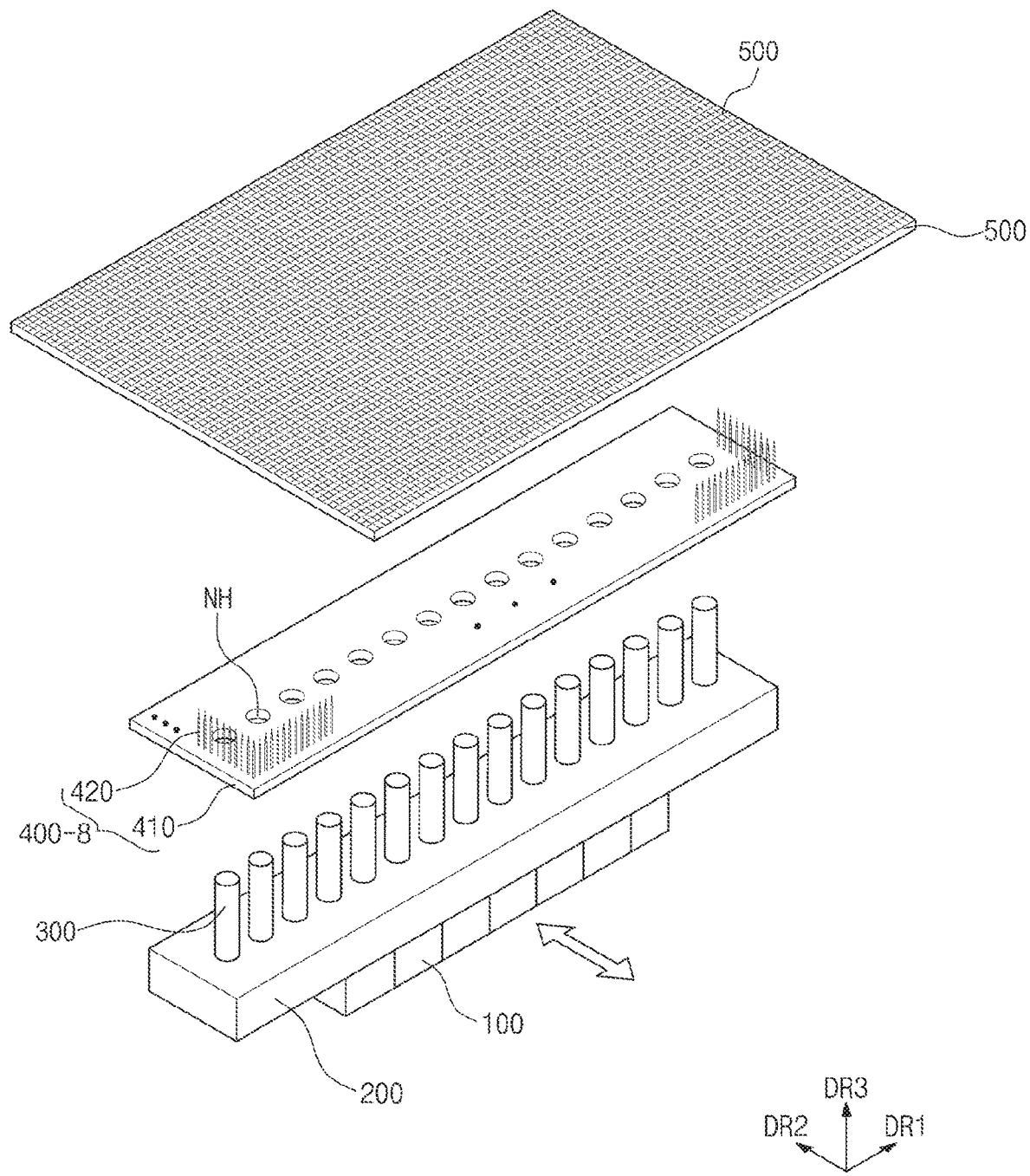
FIG. 22 is a perspective view of a deposition source, an evaporation chamber, nozzles, and an ionizer according to another exemplary embodiment of the inventive concepts.
Figure 23:
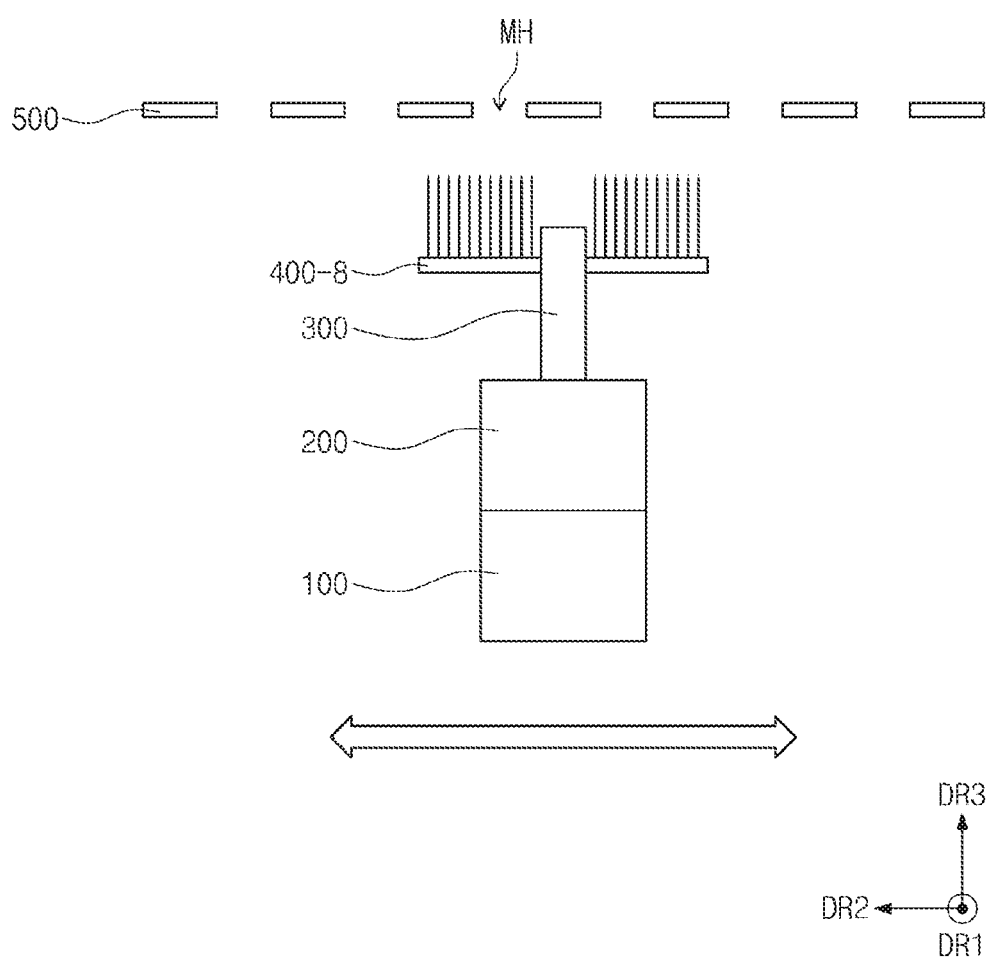
FIG. 23 is a cross-sectional view of the deposition source, the evaporation chamber, the nozzles, and the ionizer of FIG. 22.

FIG. 22 is a perspective view of a deposition source, an evaporation chamber, nozzles, and an ionizer according to another exemplary embodiment of the inventive concepts, and FIG. 23 is a cross-sectional view of the deposition source, the evaporation chamber, the nozzles, and the ionizer of FIG. 22.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

Referring to FIGS. 22 and 23, a deposition apparatus according to another exemplary embodiment has a shape in which a deposition source 100, an evaporation chamber 200, and nozzles 300 are connected to each other.

According to this embodiment, a first electrode unit 400-8 may have a shape that extends in the first direction DR1 on the plane. Particularly, a first plate 410 of the first electrode unit 400-8 may have a plate shape extending in the first direction DR1. An area of the plane, which is occupied by the first plate 410 may be less than that of the plane, which is occupied by the second electrode unit 500. The first electrode unit 400-8 may be connected to the deposition source 100, the evaporation chamber 200, and the nozzles 300.

Although not shown, the deposition apparatus according to this embodiment may further include a deposition source moving unit (not shown). The deposition source moving unit (not shown) allows the deposition source 100, the evaporation chamber 200, the nozzles 300, and the first electrode unit 400-8 to reciprocate in the second direction DR2. As the first electrode unit 400-8 moves, vapor particles injected from the nozzles 300 may be uniformly provided to the second electrode unit 500.

According to this embodiment, the vapor particles injected from the nozzles 300 may be more effectively diffused. That is, according to this embodiment, deposition uniformity of the deposition apparatus may be more improved.

Figure 24:
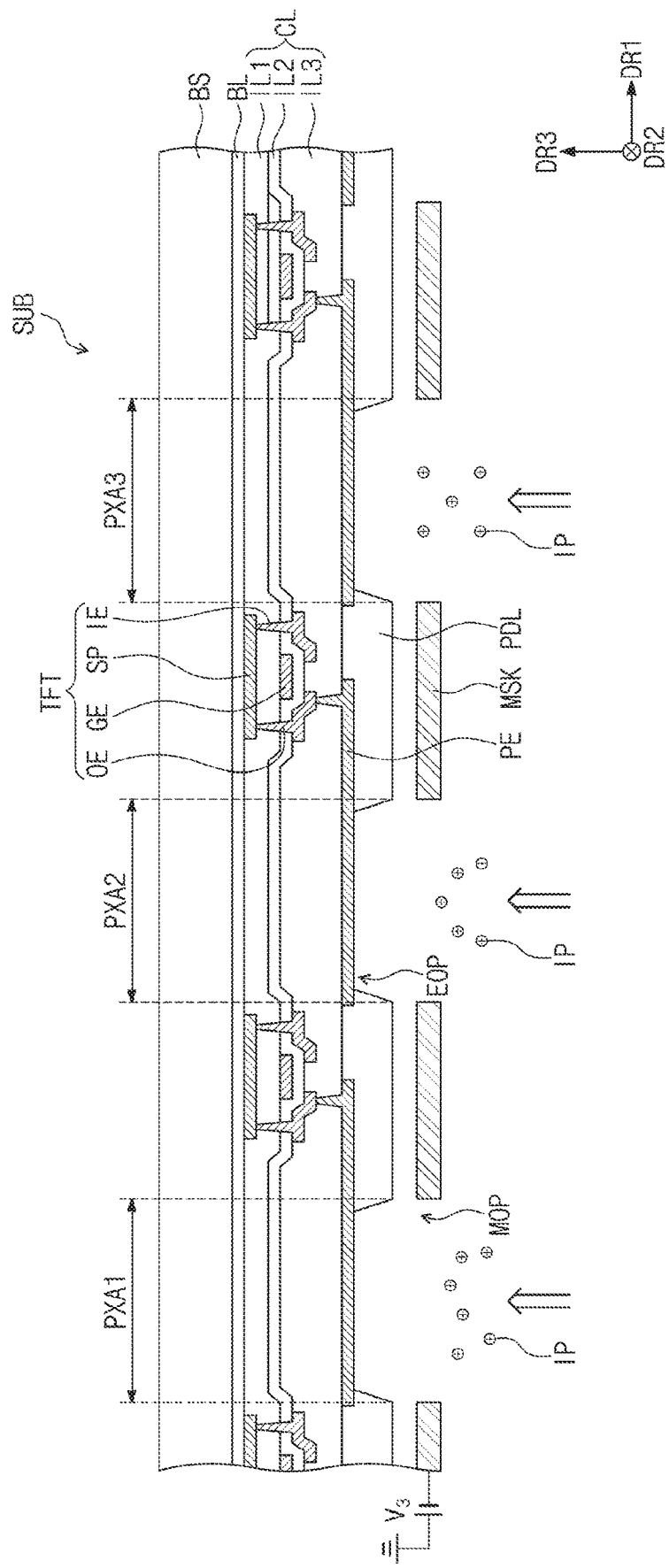
FIG. 24 is an enlarged cross-sectional view of a target substrate according to another exemplary embodiment of the inventive concepts.

FIG. 24 is an enlarged cross-sectional view of a target substrate according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

As illustrated in FIG. 24, according to another embodiment of the inventive concept, a third voltage $V_3$ may be applied to the mask MSK. A voltage is not applied to the stage STG. Thus, an electric field may be generated between the second electrode unit 500 (see FIG. 9) and the mask MSK. The electric field may have an intensity less than that of the above-described first electric field.

According to this embodiment, charged particles IP that are charged by the nozzles 300 (see FIG. 9) or the ionizer IZ (see FIG. 9) may be incident toward the mask MSK. The charged particles IP may pass through the mask openings MOP of the mask MSK and then be deposited on the pixel areas PXA1 to PXA3 on the target substrate SUB.

Figure 25:
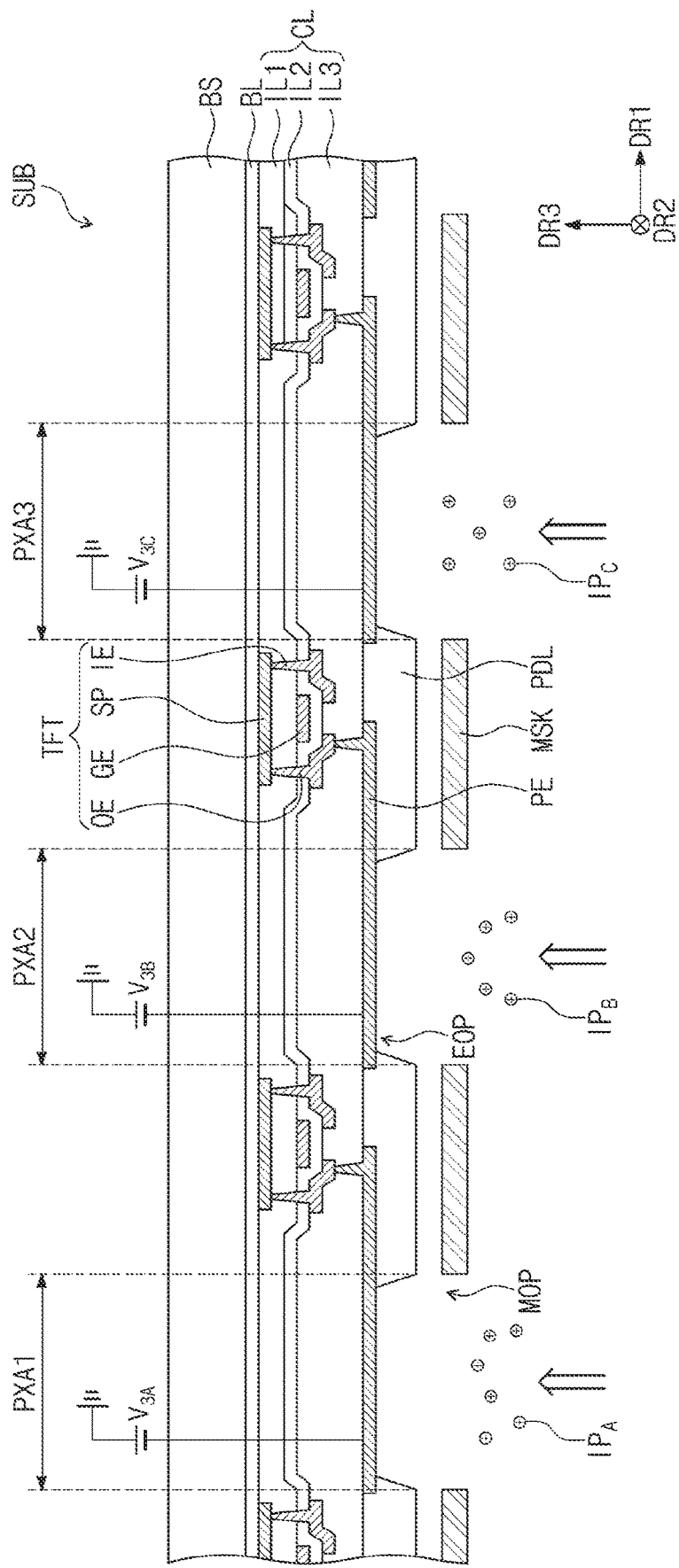
FIG. 25 is an enlarged cross-sectional view of a target substrate according to another exemplary embodiment of the inventive concepts.

FIG. 25 is an enlarged cross-sectional view of a target substrate according to another exemplary embodiment of the inventive concepts.

For convenience of description, differences between this embodiment and the foregoing embodiment will be mainly described, and omitted descriptions will be derived from the foregoing embodiment. Also, the same reference symbol is given to the same component, and duplicated descriptions with respect to the component will be omitted.

As illustrated in FIG. 25, according to another exemplary embodiment, third voltages $V_{3A}$, $V_{3B}$, and $V_{3C}$ may be applied to pixel electrodes PE of a target substrate SUB. Each of the third voltages may be less than the second voltage $V_2$. A voltage may not be applied to the stage STG and the mask MSK. Thus, an electric field may be generated between the pixel electrodes PE and the second electrode unit 500 (see FIG. 9). The electric field may have an intensity less than that of the above-described first electric field.

According to this embodiment, charged particles IP that are charged by the nozzles 300 (see FIG. 9) or the ionizer IZ (see FIG. 9) may be incident toward the target substrate SUB. The charged particles IP may pass through the mask openings MOP of the mask MSK and then be deposited on the pixel areas PXA1 to PXA3 on the target substrate SUB.

Also, according to an exemplary embodiment of the inventive concepts, when different deposition materials are deposited on the pixels PXA1 to PXA3, the voltages $V_{3A}$, $V_{3B}$, and $V_{3C}$ applied to the pixel electrodes PE may be different from each other according to the kinds of pixel areas PXA1 to PXA3. For example, the deposition materials deposited on the pixel areas PXA1 to PXA3 may constitute light emitting layers EL (see FIG. 11) that emit light having colors different from each other.

Particularly, a first sub voltage $V_{3A}$ may be applied to the pixel electrode PE disposed on the first pixel area PXA1, a second sub voltage $V_{3B}$ may be applied to the pixel electrode PE disposed on the second pixel area PXA2, and a third sub voltage $V_{3C}$ may be applied to the pixel electrode PE disposed on the third pixel area PXA3. Each of the first to third sub voltages $V_{3A}$, $V_{3B}$, and $V_{3C}$ is less than the second voltage $V_2$ (see FIG. 9). The first to third sub voltages $V_{3A}$, $V_{3B}$, and $V_{3C}$ may be determined by ionization energy values or decomposition energy values of the deposition materials deposited on the pixel areas PXA1 to PXA3.

Figure 26:
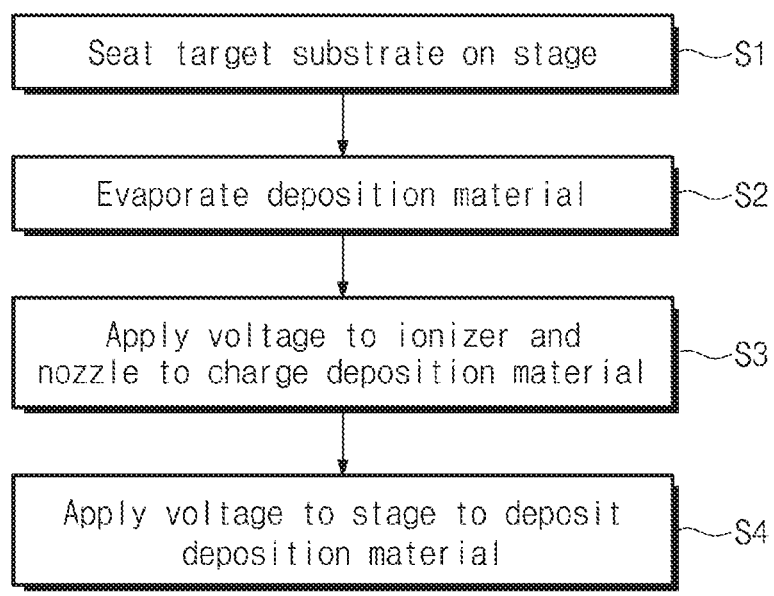
FIG. 26 is a flowchart illustrating a deposition method according to an exemplary embodiment of the inventive concepts.

FIG. 26 is a flowchart illustrating a deposition method according to an exemplary embodiment of the inventive concepts.

Hereinafter, a deposition method using the deposition apparatus according to an exemplary embodiment will be described later.

First, a target substrate SUB (see FIG. 10) is seated on a stage STG (see FIG. 1) (S1). As illustrated in FIG. 10, the target substrate SUB (see FIG. 10) may be provided by sequentially forming a base layer BS, a circuit layer CRL, and pixel electrodes PE.

Thereafter, a deposition material of a deposition source 100 is evaporated (S2). The deposition material may be evaporated in an evaporation chamber 200 (see FIG. 3). The evaporated deposition material is provided in the form of a plurality of vapor particles DP (see FIG. 7) to the nozzles 300.

Thereafter, voltages $V_N$, $V_1$, and $V_2$ may be applied to the ionizer IZ (see FIG. 9) and the nozzles 300 (see FIG. 9) to generate a first electric field $EF_1$ in the ionizer IZ (see FIG. 9) and the nozzles 300 (see FIG. 9). The deposition material may be charged by the first electric field $EF_1$ (S3).

Particularly, the charging voltage $V_N$ is applied to the nozzles 300 (see FIG. 9), the first voltage $V_1$ is applied to the first electrode unit 400, and the second voltage $V_2$ is applied to the second electrode unit 500. In this embodiment, each of the charging voltage $V_N$ and the first voltage $V_1$ is greater than the second voltage $V_2$. The deposition material may be charged by pin electrodes 420 (see FIG. 5) of the ionizer IZ and protrusion tips PT (see FIG. 7) the nozzles 300.

Thereafter, a third voltage $V_3$ is applied to the stage STG to generate a second electric field between the second electrode unit 500 (see FIG. 9) and the stage STG. The third voltage $V_3$ may be less than the second voltage $V_2$. The second electric filed $EF_2$ may have an intensity less than that of the first electric field $EF_1$.

According to another exemplary embodiment of the inventive concepts, the second electric field $EF_2$ may be generated between the second electrode unit 500 (see FIG. 9) and the stage STG through various methods in addition to the method in which the third voltage $V_3$ is applied to the stage STG. For example, as illustrated in FIGS. 23 and 24, the second electric field $EF_2$ may be generated between the second electrode unit 500 (see FIG. 9) and the stage STG through a method in which the third $V_3$ is applied to the mask MSK (see FIG. 23) or a method in which the third voltage $V_3$ is applied to each of the pixel electrodes PE of the target substrate SUB.

The second electric field $EF_2$ may guide a moving direction so that the charged deposition material is incident into the target substrate SUB. In this embodiment, the direction in which the deposition material is incident into the target substrate SUB may be about 80 degrees to about 100 degrees with respect to the top surface of the target substrate SUB.

According to the exemplary embodiments of the inventive concepts, the deposition material may be uniformly deposited on the substrate. That is, the organic light emitting display device may be improved in yield.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A deposition apparatus comprising:
   a chamber;
   a stage which is disposed within the chamber and on which a target substrate is seated;
   a deposition source disposed within the chamber and comprising a deposition material;
   a plurality of nozzles connected to the deposition source within the chamber to inject the deposition material in a direction of the stage; and
   an ionizer disposed between the nozzles and the stage to charge the deposition material injected from the nozzles,
   wherein a first electric field is generated in each of the ionizer and the nozzles,
   a second electric field having an intensity less than that of the first electric field is generated between the stage and the ionizer, and
   each of the nozzles comprises a plurality of protrusion tips disposed on an inner surface of each of the nozzles to charge the deposition material.

2. The deposition apparatus of claim 1, wherein a top surface of each of the nozzles has a shape pointed upward on a cross-section.

3. A deposition apparatus comprising:
   a chamber;
   a stage which is disposed within the chamber and on which a target substrate is seated;
   a deposition source disposed within the chamber and comprising a deposition material;
   a plurality of nozzles connected to the deposition source within the chamber to inject the deposition material in a direction of the stage; and
   an ionizer disposed between the nozzles and the stage to charge the deposition material injected from the nozzles,
   wherein a first electric field is generated in each of the ionizer and the nozzles,
   a second electric field having an intensity less than that of the first electric field is generated between the stage and the ionizer, and
   the ionizer comprises:
   a first electrode unit; and
   a second electrode unit disposed between the first electrode unit and the stage and having a plate shape in which a plurality of mesh holes are defined,
   wherein the first electrode unit comprises:
   a first plate having a plate shape; and
   a plurality of pin electrodes disposed on the first plate to charge the deposition material injected from the nozzles.

4. The deposition apparatus of claim 3, wherein a charging voltage is applied to the nozzles,
   a first voltage is applied to the first electrode unit,
   a second voltage less than each of the first voltage and the charging voltage is applied to the second electrode unit, and
   a third voltage less than the second voltage is applied to the stage.

5. The deposition apparatus of claim 4, wherein the charging voltage is the same as the first voltage.

6. The deposition apparatus of claim 4, wherein the nozzles are electrically connected to the first electrode unit.

7. The deposition apparatus of claim 3, wherein a distance between the first electrode unit and the second electrode unit or between each of the nozzles and the second electrode unit is less than that between the second electrode unit and the stage.

8. The deposition apparatus of claim 3, wherein the first plate comprises a plurality of nozzle holes defined therein to pass through the first plate, and
   at least a portion of each of the plurality of nozzles is inserted into a respective one of the nozzle holes.

9. The deposition apparatus of claim 3, further comprising a mask disposed between the stage and the ionizer,
   wherein the deposition material is deposited on an area of the target substrate, which is exposed from the mask.

10. The deposition apparatus of claim 9, wherein a charging voltage is applied to the nozzles,
    a first voltage is applied to the first electrode unit,
    a second voltage less than each of the first voltage and the charging voltage is applied to the second electrode unit, and
    a third voltage less than the second voltage is applied to the mask.

11. The deposition apparatus of claim 3, wherein an inner surface of each of the mesh holes of the second electrode unit comprises at least one inclined surface, and
    the inner surface of each of the mesh holes has a shape pointed toward a center of each of the mesh holes on a plane.

12. The deposition apparatus of claim 11, further comprising sub heating members configured to respectively surround the plurality of nozzles.

13. The deposition apparatus of claim 3, wherein a density of the pin electrodes decreases in a direction that is adjacent to the nozzles on the first plate.

14. The deposition apparatus of claim 3, wherein the nozzles are arranged in a first direction to overlap a central portion of the stage on a plane, and
    the second electrode unit comprises:

a first mesh electrode extending in the first direction to overlap the central portion of the stage on the plane; and a plurality of second mesh electrodes facing each other with the first mesh electrode therebetween in a second direction perpendicular to the first direction on the plane, wherein an electric field generated between the first mesh electrode and the first electrode unit has an intensity less than that of an electric field generated between the second mesh electrode and the first electrode unit.

15. The deposition apparatus of claim 14, wherein a voltage applied to the first mesh electrode is greater than that applied to the second mesh electrode.

16. The deposition apparatus of claim 14, wherein a distance between the first mesh electrode and the first electrode unit is greater than that between the second mesh electrode and the first electrode unit.

17. The deposition apparatus of claim 3, further comprising a third electrode unit which is disposed between the ionizer and the stage and in which a plurality of holes are defined, wherein the second electric field is generated between the third electrode unit and the stage.

18. The deposition apparatus of claim 17, wherein a charging voltage is applied to the nozzles, a first voltage is applied to the first electrode unit, a second voltage less than each of the first voltage and the charging voltage is applied to the second electrode unit, a third voltage less than the second voltage is applied to the stage, and a fourth voltage equal to or less than the second voltage and greater than the third voltage is applied to the third electrode unit.

19. The deposition apparatus of claim 3, wherein the target substrate comprises:

a base layer;

a plurality of thin film transistors disposed on the base layer; and a pixel electrodes electrically connected to one-to-one correspond to the thin film transistors, wherein the deposition material is deposited on the pixel electrodes.

20. The deposition apparatus of claim 19, wherein a charging voltage is applied to the nozzles, a first voltage is applied to the first electrode unit, a second voltage less than each of the first voltage and the charging voltage is applied to the second electrode unit, and a third voltage less than the second voltage is applied to at least one of the pixel electrodes.

21. The deposition apparatus of claim 3, further comprising a deposition source moving unit disposed adjacent to the deposition source to allow the deposition source to move.

22. The deposition apparatus of claim 21, wherein the nozzles are arranged in a first direction, and the first plate of the first electrode unit has a shape extending in the first direction.

23. The deposition apparatus of claim 1, further comprising at least one heating member configured to surround the deposition source.

24. The deposition apparatus of claim 1, further comprising a second deposition source disposed within the chamber, the second deposition source comprising a second deposition material that is different from the deposition material.

25. The deposition apparatus of claim 1, wherein the first electric field has an intensity equal to or greater than an ionization energy value of the deposition material and less than a decomposition energy value of the deposition material.

26. The deposition apparatus of claim 1, further comprising an evaporation chamber disposed between the nozzles and the deposition source to evaporate the deposition material.

27. A deposition apparatus comprising:

a chamber;

a stage which is disposed within the chamber and on which a target substrate is seated;

a mask disposed on the target substrate;

a deposition source disposed within the chamber and comprising a deposition material;

a plurality of nozzles connected to the deposition source within the chamber to inject the deposition material and comprising a plurality of protrusion tips disposed on an inner surface of each of the nozzles to charge the deposition material; and an ionizer disposed between the nozzles and the stage, wherein the ionizer comprises:

a first electrode unit comprising a plurality of pins configured to charge the deposition material injected from the nozzles; and a second electrode unit facing the first electrode unit and configured to generate a first electric field together with the first electrode unit and each of the nozzles, wherein the second electrode unit generates a second electric field having an intensity less than that of the first electric field together with at least one of the stage, the target substrate, or the mask.

* * * * *